United States Patent
Inoue et al.

(10) Patent No.: US 9,006,807 B2
(45) Date of Patent: Apr. 14, 2015

(54) SOLID-STATE IMAGE SENSING DEVICE AND CAMERA

(71) Applicant: Kabushiki Kaisha Toshiba, Tokyo (JP)

(72) Inventors: Ikuko Inoue, Yokohama (JP); Masahiro Baba, Tokyo (JP); Eiji Sato, Kawasaki (JP); Haruhide Kikuchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 35 days.

(21) Appl. No.: 13/848,966

(22) Filed: Mar. 22, 2013

(65) Prior Publication Data

US 2013/0248862 A1    Sep. 26, 2013

(30) Foreign Application Priority Data

Mar. 23, 2012 (JP) ................. 2012-067424

(51) Int. Cl.
- H01L 31/062 (2012.01)
- H01L 31/0224 (2006.01)
- H01L 31/0232 (2014.01)
- H01L 27/146 (2006.01)

(52) U.S. Cl.
CPC ...... *H01L 31/0224* (2013.01); *H01L 31/02325* (2013.01); *H01L 27/14618* (2013.01); *H01L 27/1463* (2013.01); *H01L 27/14636* (2013.01); *H01L 27/1464* (2013.01)

(58) Field of Classification Search
CPC ............ H01L 27/1463; H01L 27/14636; H01L 27/1464; H01L 27/14618; H01L 31/0224; H01L 31/02325
USPC .......................... 257/291, 292, 432
See application file for complete search history.

(56) References Cited

U.S. PATENT DOCUMENTS

| | | | |
|---|---|---|---|
| 8,704,924 B2 * | 4/2014 | Watanabe et al. ............. 348/301 |
| 2004/0080013 A1 | 4/2004 | Kimura et al. |
| 2004/0080045 A1 | 4/2004 | Kimura et al. |
| 2008/0308890 A1 | 12/2008 | Uya |
| 2010/0045837 A1 | 2/2010 | Yamashita |

(Continued)

FOREIGN PATENT DOCUMENTS

| | | |
|---|---|---|
| JP | 2004-152811 A | 5/2004 |
| JP | 2004-152812 A | 5/2004 |

(Continued)

OTHER PUBLICATIONS

Korean Office Action issued Dec. 19, 2013 in Patent Application No. 10-2013-0014365 with English Translation.

(Continued)

*Primary Examiner* — Tan N Tran
(74) *Attorney, Agent, or Firm* — Oblon, McClelland, Maier & Neustadt, L.L.P.

(57) ABSTRACT

According to one embodiment, a solid-state image sensing device includes a semiconductor substrate having a first and second surface, an insulating film covering an element on the first surface, a pixel array including pixels configured to photoelectrically convert light applied on the side of the second surface, contact regions in the semiconductor substrate, one or more through-electrodes respectively provided in the contact regions, and first pads provided on the side of the second surface to correspond to the respective contact regions. The first pad extends in a first direction from the contact regions toward the pixel array.

15 Claims, 15 Drawing Sheets

(56) References Cited

U.S. PATENT DOCUMENTS

2010/0213560 A1  8/2010  Wang et al.
2010/0244175 A1  9/2010  Park
2012/0001286 A1* 1/2012  Yoon ............................ 257/432

FOREIGN PATENT DOCUMENTS

| JP | 2005-347708 A | 12/2005 |
| JP | 2006-32497 | 2/2006 |
| JP | 2007-134664 A | 5/2007 |
| JP | 2008-311413 | 12/2008 |
| JP | 2010-050149 | * 3/2010 |
| JP | 2010-50149 A | 3/2010 |
| JP | 2010-199589 | 9/2010 |
| JP | 2010-267736 A | 11/2010 |
| KR | 10-2010-0102533 | 9/2010 |

OTHER PUBLICATIONS

U.S. Appl. No. 13/948,600, filed Jul. 23, 2013, Yoda, et al.
Office Action issued on May 13, 2014 in a basic/corresponding Patent Application No. 2012-067424 (with English Translation).

* cited by examiner

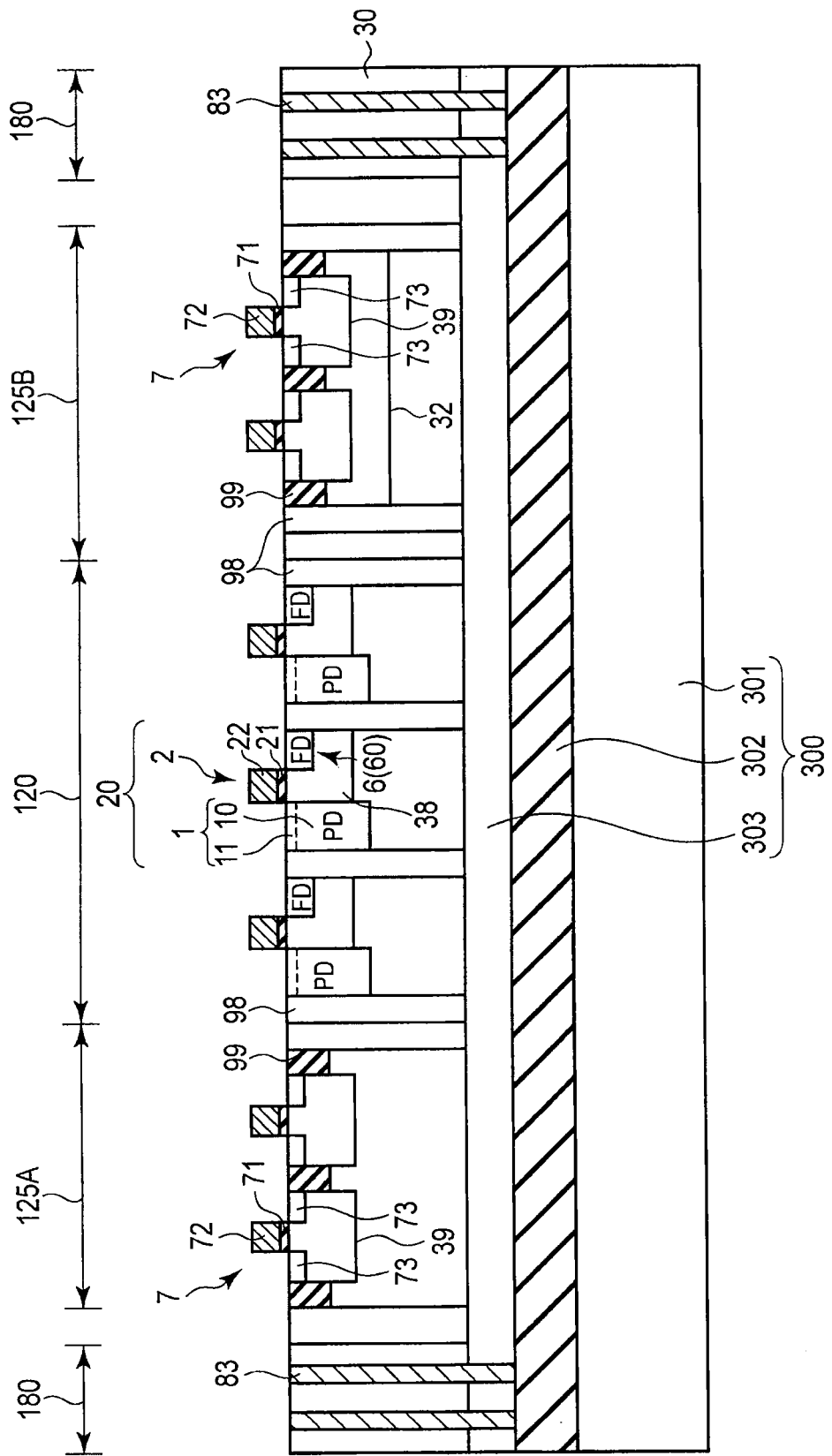
F I G. 9

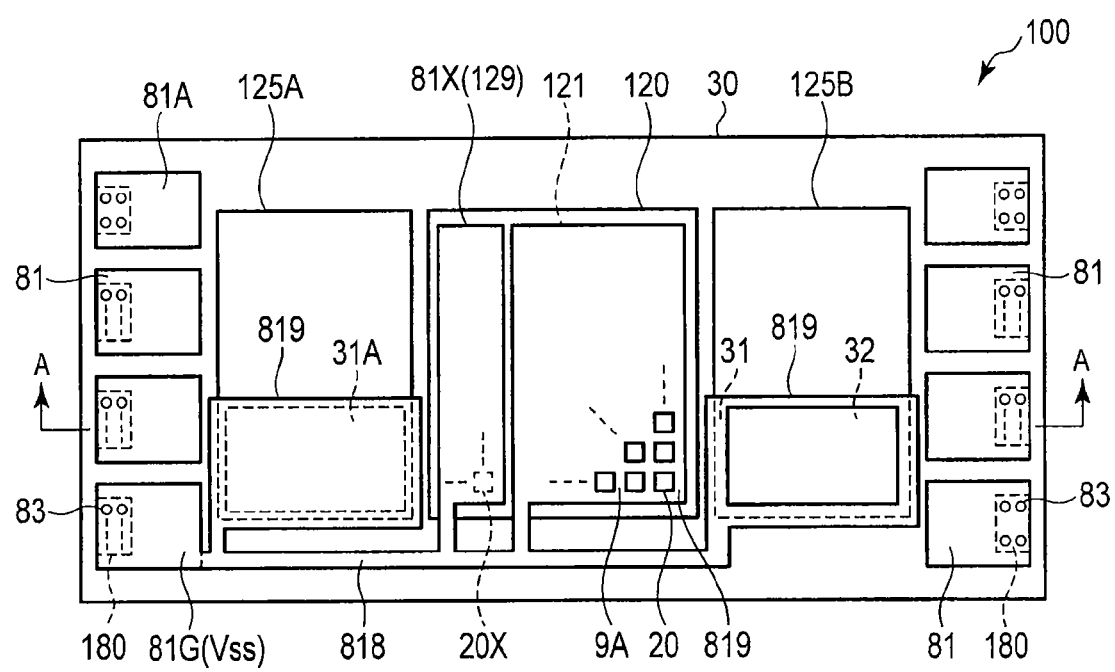
F I G. 15

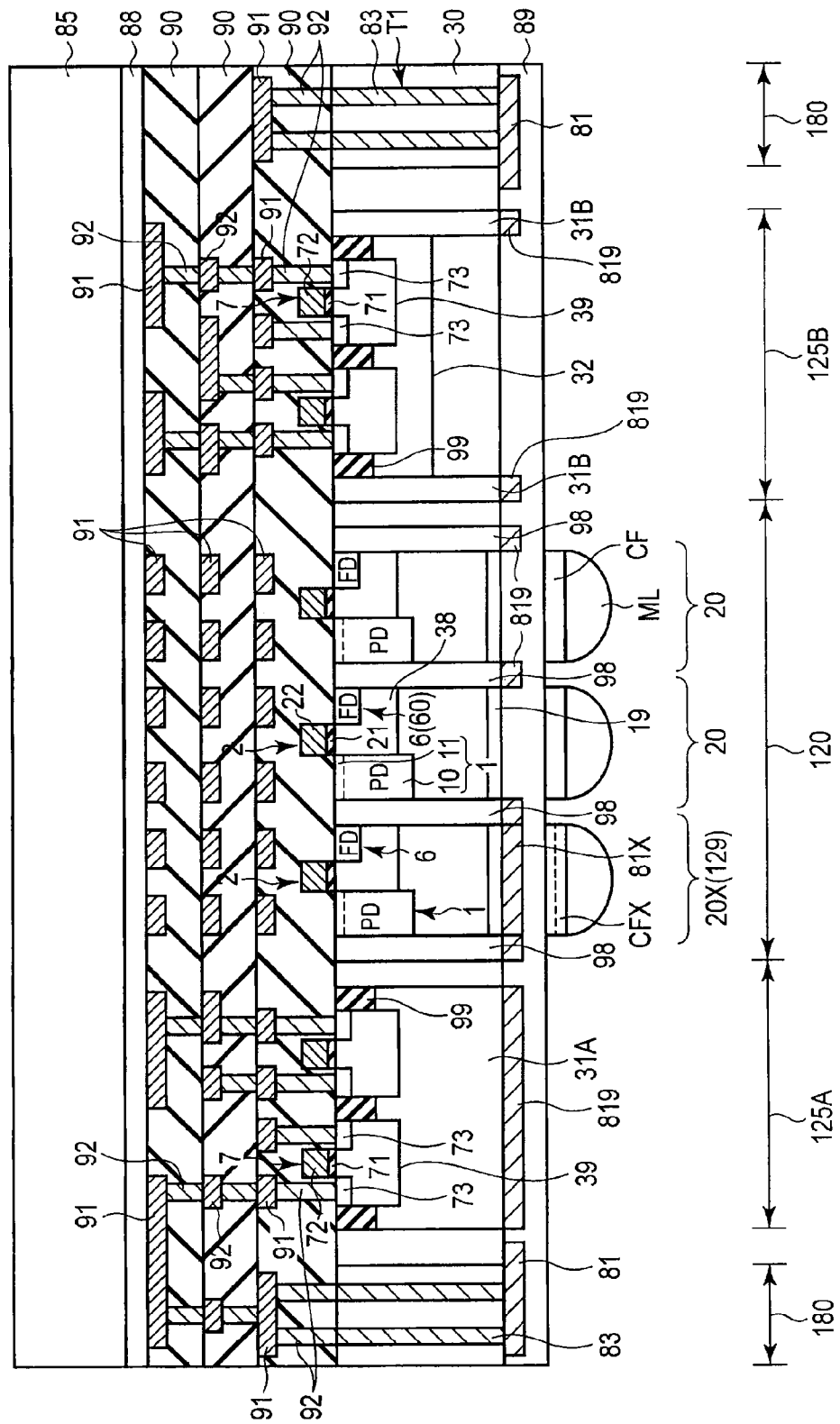
F I G. 16

SOLID-STATE IMAGE SENSING DEVICE AND CAMERA

CROSS-REFERENCE TO RELATED APPLICATIONS

This application is based upon and claims the benefit of priority from Japanese Patent Application No. 2012-067424, filed Mar. 23, 2012, the entire contents of which are incorporated herein by reference.

FIELD

Embodiments described herein relate generally to a solid-state image sensing device and a camera.

BACKGROUND

Solid-state image sensing device such as CCD image sensors and CMOS image sensors are used for various purposes in, for example, digital still cameras, video cameras, or surveillance cameras.

A back-side illumination image sensor can eliminate an obstacle to light such as interconnection between pixels and a microlens. Therefore, the back-side illumination image sensor permits higher pixel sensitivity to incident light and lower optical shading.

Accordingly, the development of the back-side illumination image sensors has been carried on in recent years.

BRIEF DESCRIPTION OF THE DRAWINGS

FIG. 9 is a view illustrating a step in the method of manufacturing the solid-state image sensing device according to the first embodiment;

FIG. 15 is a schematic plan view showing a structure example of a solid-state image sensing device according to a third embodiment; and FIG. 16 is a schematic sectional view showing a structure example of the solid-state image sensing device according to the third embodiment.

DETAILED DESCRIPTION

Embodiments

Hereinafter, embodiments will be described in detail with reference to the drawings. Elements having the same functions and configurations are provided with the same reference signs in the following explanation, and are repeatedly explained when necessary.

In general, according to one embodiment, a solid-state image sensing device includes a semiconductor substrate including a first surface and a second surface opposite to the first surface; an insulating film covering an element on the first surface; a pixel array which is provided in the semiconductor substrate and which includes pixels configured to photoelectrically convert light applied on the side of the second surface; a plurality of contact regions provided in the semiconductor substrate; one or more through-electrodes which are respectively provided in the contact regions and which are pierced from the first surface toward the second surface; and a plurality of first pads which are provided on the side of the second surface to correspond to the respective contact regions and which extend in a first direction from the contact regions toward the pixel array.

(1) First Embodiment

A solid-state image sensing device according to the first embodiment is described with reference to FIG. 1 to FIG. 12.

(a) Structure

The structure of the solid-state image sensing device according to the first embodiment is described with reference to FIG. 1 to FIG. 5.

Figure 1:
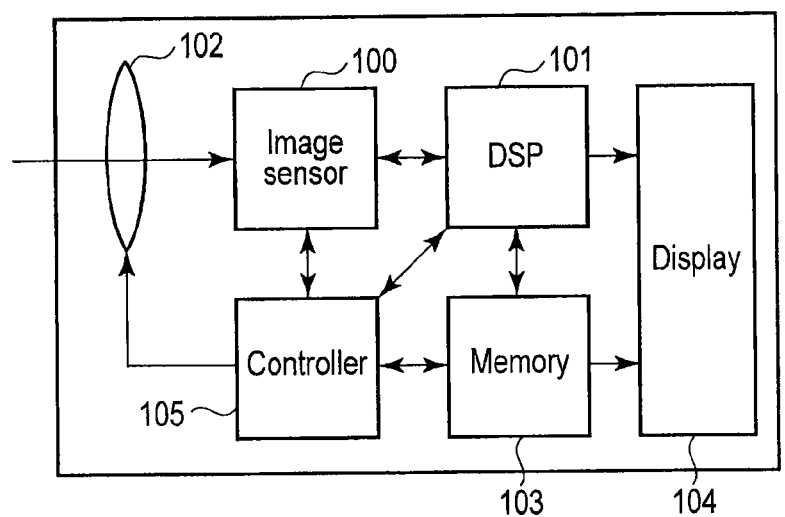
FIG. 1 is a diagram showing an example of a module including a solid-state image sensing device according to an embodiment.
Figure 2:
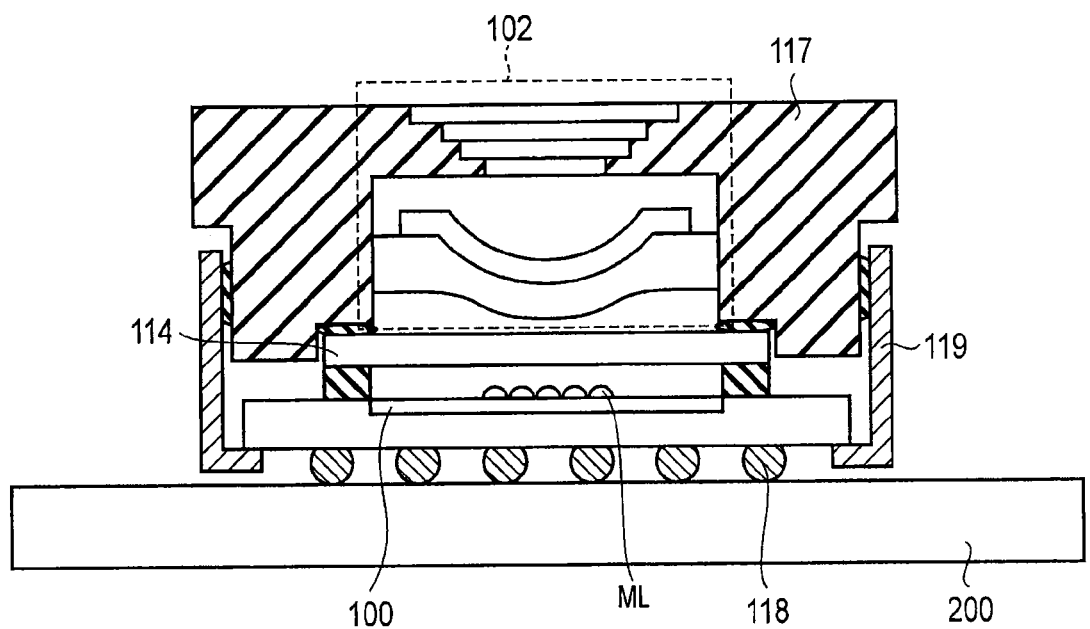
FIG. 2 is a diagram showing an example of the module including the solid-state image sensing device according to the embodiment.

FIG. 1 and FIG. 2 are schematic diagrams illustrating the solid-state image sensing device according to the present embodiment. FIG. 1 is a block diagram showing the configuration of a module including a solid-state image sensing device (for example, an image sensor) 100 according to the present embodiment. FIG. 2 is a sectional view showing structure of the module including the image sensor 100 according to the present embodiment. The module that includes the image sensor 100 according to the present embodiment is referred to as a camera module.

As shown in FIG. 1, the camera module includes the image sensor 100. In addition to the image sensor 100, the camera module in FIG. 1 includes, for example, a signal processing unit 101, an optical lens unit 102, a memory 103, a display 104, and a controller 105.

The image sensor 100 converts incident light (light from a subject) corresponding to an image to an electrical signal. The optical lens unit 102 collects the incident light (light from the subject) to the image sensor 100, and focuses the image corresponding to the incident light on the image sensor 100. The optical lens unit 102 includes a plurality of lenses, and can mechanically or electrically control optical characteristics (for example, focal distance).

The signal processing unit (for example, a digital signal processor [DSP]) 101 processes the electrical signal output from the image sensor 100. The signal from the DSP 101 is stored in the memory 103. An externally supplied signal and data can also be stored in the memory 103.

The display 104 displays the signal from the DSP 101 or the signal from the memory 103. The signal from the DSP 101 and the signal from the memory 103 are image data (still image data or moving image data) corresponding to the light from the subject acquired by the image sensor. The controller 105 controls the operations of the components 101 to 104 in the camera module.

As shown in FIG. 2, the image sensor 100 is packaged, and is provided on a circuit board (module substrate, flexible substrate) 200. A chip of the image sensor 100 is packaged by the use of a substrate such as a lead frame or a ball grid array (BGA) (hereinafter referred to as a package substrate).

A lens holder 117 including the optical lens unit 102 is attached to the image sensor 100. Light from the optical lens unit 102 is applied to a pixel array in the image sensor 100 via a microlens array ML attached to the image sensor 100. The optical lens unit 102 includes a plurality of lenses, and can mechanically or electrically control the optical characteristics of the optical lens unit 102.

A stack 114 of, for example, a filter and a protective film is attached to the upper part of the image sensor 100 via an adhesive agent. A shield 119 is attached to the image sensor 100 and the lens holder 117 to cover the side surface of the image sensor 100. For example, as long as the DSP 101, the memory 103, and the controller 105 are electrically connected to the image sensor 100, the DSP 101, the memory 103, and the controller 105 may be provided on the same substrate (chip or circuit board) as the image sensor 100, or may be provided on a substrate different from that of the image sensor 100. The DSP 101, the memory 103, and the controller 105 may be provided inside the shield 119 or may be provided outside the shield 119.

The module including the image sensor 100 is connected to a connector (not shown) or an interconnect (not shown) formed on the circuit board 200 by electrodes (for example, solder balls or pins) 118.

Figure 3:
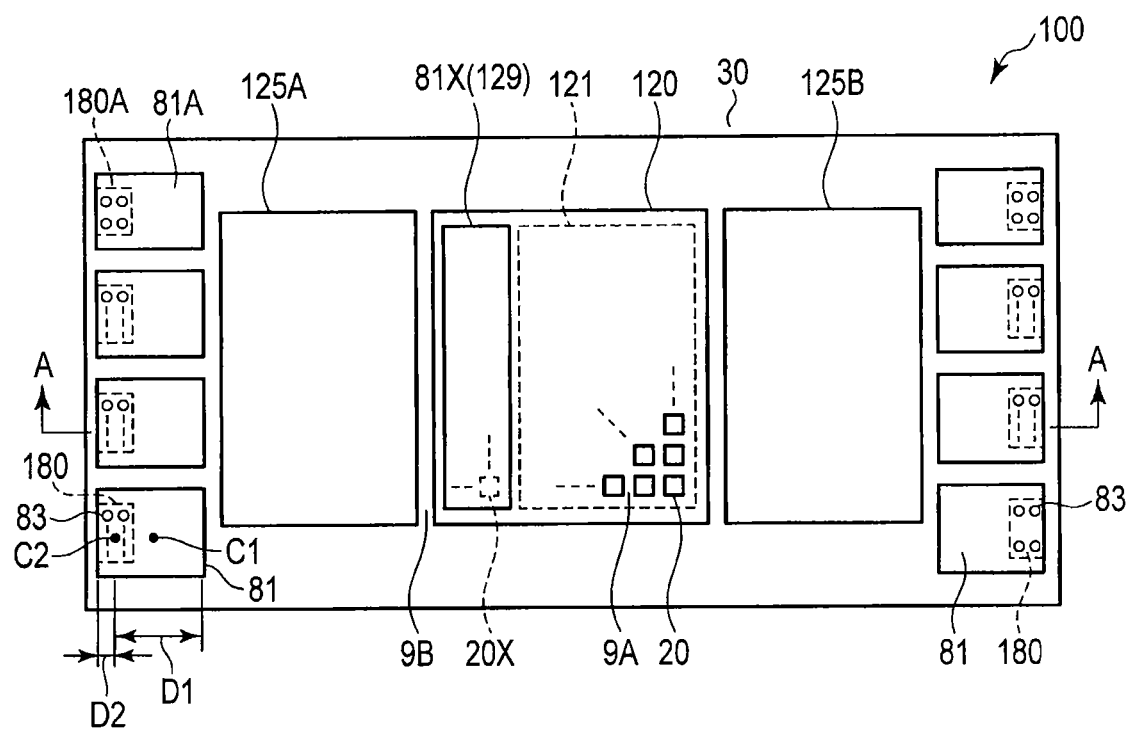
FIG. 3 is a schematic plan view showing a structure example of the solid-state image sensing device according to a first embodiment.
Figure 4:
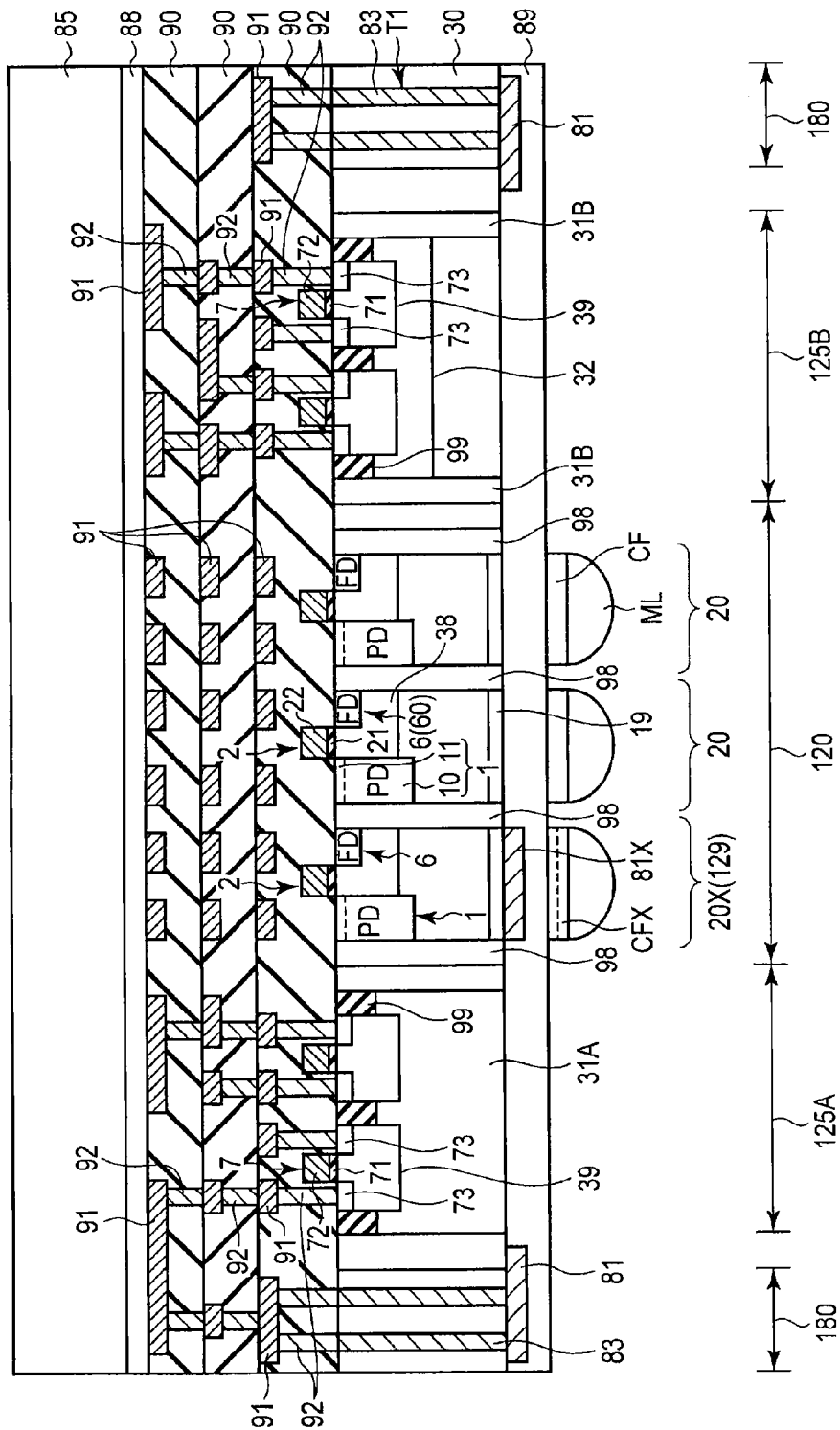
FIG. 4 is a schematic sectional view showing a structure example of the solid-state image sensing device according to the first embodiment.

The structure of the image sensor 100 according to the present embodiment is described with reference to FIG. 3 to FIG. 5. FIG. 3 is a schematic plan view showing a planar structure of the image sensor 100 according to the present embodiment. FIG. 4 is a schematic sectional view showing a sectional structure of the image sensor 100 according to the present embodiment. FIG. 4 schematically shows the sectional structure along the line A-A in FIG. 3.

As shown in FIG. 3 and FIG. 4, in the image sensor 100 according to the present embodiment, regions (hereinafter referred to as peripheral circuit regions) 125A and 125B in which a pixel array 120 and a circuit for driving the pixel array 120 are provided in one semiconductor substrate (chip) 30. The semiconductor substrate 30 has a first surface, and a second surface opposite to the first surface in a direction perpendicular to the first surface.

The pixel array 120 includes a plurality of unit cells 20. Each unit cell 20 includes a pixel (also referred to as a photoelectric converter) for converting external incident light to an electrical signal. One unit cell 20 includes at least one pixel. A logic circuit and an analog circuit are provided in peripheral circuit regions 125A and 125B.

The unit cells 20 adjacent to each other and the pixels included therein are isolated by an element isolation region 9A. Each unit cell 20 and a pixel formation region are surrounded by the element isolation region 9A. An element isolation region 9B is provided between the pixel array 120 and peripheral circuit regions 125A and 125B.

According to the present embodiment, a photodiode is used to form the pixel. One photodiode corresponds to one pixel. For example, a photodiode 1 as a pixel is used to form a CMOS sensor or a CCD sensor.

Here, one example of an internal configuration of the pixel array 120 is described with reference to FIG. 5. FIG. 5 is a diagram showing a circuit configuration example of the pixel array 120 and circuits in its vicinity.

The unit cells 20 are arranged in matrix form in the pixel array 120. Each unit cell 20 is provided at the intersection of control lines TRF, RST, and ADR and a signal line VSL.

The unit cell 20 includes, for example, the photodiode 1 and a circuit (element) for controlling the operation of the photodiode 1. The circuit for controlling the operation of the photodiode 1 of the unit cell 20 is made up of, for example, four field effect transistors 2, 3, 4, and 5. Each of the field effect transistors 2, 3, 4, and 5 is, for example, an n-channel MOS transistor. The four field effect transistors included in the unit cell 20 are hereinafter referred to as a transfer gate (read transistor) 2, an amplifier transistor 3, a reset transistor 4, and an address transistor 5, respectively.

In the unit cell 20 including the photodiode 1, a charge is generated in the photodiode 1 in accordance with the amount of light (light from the subject) entering the photodiode 1. The photodiode 1 is capable of storing the generated charge.

The cathode of the photodiode 1 is connected to a floating diffusion (floating diffusion layer) 6 as a signal detector via the current path of the transfer gate 2.

The transfer gate 2 controls the storage and release of a signal charge by the photodiode 1. The gate of the transfer gate 2 is connected to the read control line (read signal line) TRF. One end of the current path of the transfer gate 2 is connected to the cathode of the photodiode 1, and the other end of the current path of the transfer gate 2 is connected to the floating diffusion 6.

When the transfer gate 2 is off, the charge is kept stored in the photodiode 1. When the transfer gate 2 is on, the charge stored in the photodiode 1 is output to the floating diffusion 6 via a channel of the transfer gate 2 in an on-state.

The amplifier transistor 3 amplifies the signal (potential of the floating diffusion 6) held in the floating diffusion 6. The gate of the amplifier transistor 3 is connected to the floating diffusion 6. One end of the current path of the amplifier transistor 3 is connected to the vertical signal line VSL, and the other end of the current path of the amplifier transistor 3 is connected to one end of the current path of the address transistor 5. The signal amplified by the amplifier transistor 3 is output to the vertical signal line VSL. The amplifier transistor 3 is driven in accordance with the intensity of the potential of the floating diffusion 6 applied to the gate of the amplifier transistor 3. The amplifier transistor 3 functions as a source follower in the unit cell 20.

The reset transistor 4 resets the potential of the floating diffusion 6 (the gate potential of the amplifier transistor 3). The gate of the reset transistor 4 is connected to the reset control line (reset signal line) RST. One end of the current path of the reset transistor 4 is connected to the floating diffusion 6, and the other end of the current path of the reset transistor 4 is connected to a power supply terminal 135. The power supply terminal 135 is connected to a drain power supply or a ground power supply or a unit cell in a later-described optical black region.

When the reset transistor 4 is switched on, a voltage of the power supply terminal 135 is applied to the floating diffusion 6 via a channel of the reset transistor 4. As a result, the potential of the floating diffusion 6 reaches the intensity corresponding to the voltage of the power supply terminal 135, and the floating diffusion 6 is reset.

The gate of the address transistor 5 is connected to an address control line (address signal line) ADR. One end of the current path of the address transistor 5 is connected to the other end of the current path of the amplifier transistor 3, and the other end of the current path of the address transistor 5 is connected to the power supply terminal 135. When the address transistor 5 is switched on, a voltage of the power supply terminal 135 is applied to the current path of the amplifier transistor 3 while the potential of the floating diffusion 6 is applied to the gate of the amplifier transistor 3. An output signal of the amplifier transistor 3 which is driven in accordance with the potential of the floating diffusion 6 and the voltage of the power supply terminal 135 is output to the vertical signal line VSL as an output signal of the unit cell (pixel).

In the present embodiment, a circuit configuration in which one unit cell 20 is formed by one photodiode 1 is referred to as a one-pixel one-cell structure.

A vertical shift register 133 is connected to the read control line TRF, the address control line ADR, and the reset control line RST. The vertical shift register 133 controls the potentials of the read control line TRF, the address control line ADR, and the reset control line RST to control and select, row by row, the unit cells 20 in the pixel array 120. The vertical shift register 133 outputs, to the control lines TRF, ADR, and RST, control signals (voltage pulses) for controlling the on and off of the transistors 2, 3, 4, and 5.

An AD converter 131 is connected to the vertical signal line VSL. The AD converter 131 converts an analog signal from the pixel output to the vertical signal line VSL to a digital form, and also removes noise of the signal. The AD converter 131 has, for example, a plurality of calculating units PU. One calculating unit PU is connected to one vertical signal line VSL. The calculating unit PU subjects the signal output to the vertical signal line VSL to correlated double sampling (CDS) for AD conversion and noise elimination.

A load transistor 134 is used as a current source for the vertical signal line VSL. The gate of the load transistor 134 is connected to a select signal line SF. One end of the current path of the load transistor 134 is connected to the drain of the amplifier transistor 3 via the vertical signal line VSL. The other end of the current path of the load transistor 134 is connected to a control signal line DC.

Each unit cell 20 does not need to include the address transistor 5. In this case, the unit cell 20 includes three transistors 2, 3, and 4, and has a circuit configuration in which the other end of the current path of the amplifier transistor 3 is connected to the power supply terminal 135 without passing through other transistors. When the address transistor 5 is not provided in the unit cell 20, the address signal line ADR is not provided either. Alternatively, the unit cell 20 may have a structure in which one unit cell includes a plurality of pixels (photodiodes); for example, a two-pixel one-cell structure, a four-pixel one-cell structure, or an eight-pixel one-cell structure. When one unit cell 20 includes a plurality of photodiodes, the photodiodes 1 share one floating diffusion 6, one amplifier transistor, one reset transistor, and one address transistor. In this case, the unit cell 20 includes a transfer gate independently provided for each of the photodiodes 1.

In FIG. 4, for the simplification of the drawing, the photodiode 1, the transfer gate 2, and the floating diffusion 6 are only shown among the components of the unit cell 20.

As shown in FIG. 4, the photodiode 1 is formed in the semiconductor substrate (or semiconductor layer) 30 in a formation region of the unit cells 20 of the pixel array 120 (hereinafter referred to as a unit cell formation region 20). The photodiode 1 is formed by at least one impurity layer (impurity semiconductor layer, impurity semiconductor region) 10 formed in the semiconductor substrate 30. At least one impurity layer 10 of the photodiode 1 has N-type conductivity. However, in order to improve the characteristics (for example, sensitivity) of the photodiode 1, the photodiode 1 may be formed by a plurality of impurity layers different in conductivity type and impurity concentration. A charge corresponding to the amount of the incident light photoelectrically converted by the photodiode 1 is generated in the impurity layer 10 of the photodiode 1, and stored in the impurity layer 10.

For example, a P-conductivity-type impurity layer (hereinafter referred to as a front surface shield layer) 11 is provided in the surface layer (upper layer) of the impurity layer 10 of the photodiode 1. The front surface shield layer 11 inhibits the diffusion of an impurity (for example, carbon or nitrogen) attributed to an interlayer insulating film 90 covering the semiconductor substrate 30 in the photodiode 1. The front surface shield layer 11 inhibits the deterioration of the characteristics of the photodiode 1 resulting from the impurity, for example, the generation of a dark current.

An impurity layer 60 as the floating diffusion 6 is provided in a semiconductor region (for example, a P-type semiconductor region) 38 of the semiconductor substrate 30. The impurity layer 60 of the floating diffusion 6 has, for example, an N-conductivity-type. A charge output from the photodiode 1 via the transfer gate 2 is held (stored) in the impurity layer 60 as the floating diffusion 6.

The transfer gate 2 is provided on the semiconductor substrate 30 between the photodiode 1 and the floating diffusion 6. Gate electrodes 22 of the transfer gate 2 are provided on the P-type impurity region (hereinafter represented as a P-type region) 38 of the semiconductor substrate 30 across a gate insulating film 21. For example, impurity layers (not shown) formed in the semiconductor region 38 are used as the source and drain of the transfer gate 2. The impurity layer included in the photodiode 1 or the impurity layer as the floating diffusion 6 may be used as the source and drain of the transfer gate 2.

An element isolation region 98 provided in the element isolation region 9A is provided in the semiconductor substrate 30 to surround the adjacent unit cells 20 and the adjacent photodiodes 1. The adjacent unit cells 20 and the adjacent photodiodes 1 are electrically isolated from one another by the element isolation region 98. The element isolation layer 98 in the pixel array 120 is formed, for example, by an impurity layer (hereinafter referred to as an element isolation impurity layer). The impurity layer 98 as the element isolation layer has, for example, a P-conductivity-type. The element isolation layer 98 in the pixel array 120 may be formed by an insulating film (element isolation insulating film) having an STI structure.

Figure 5:
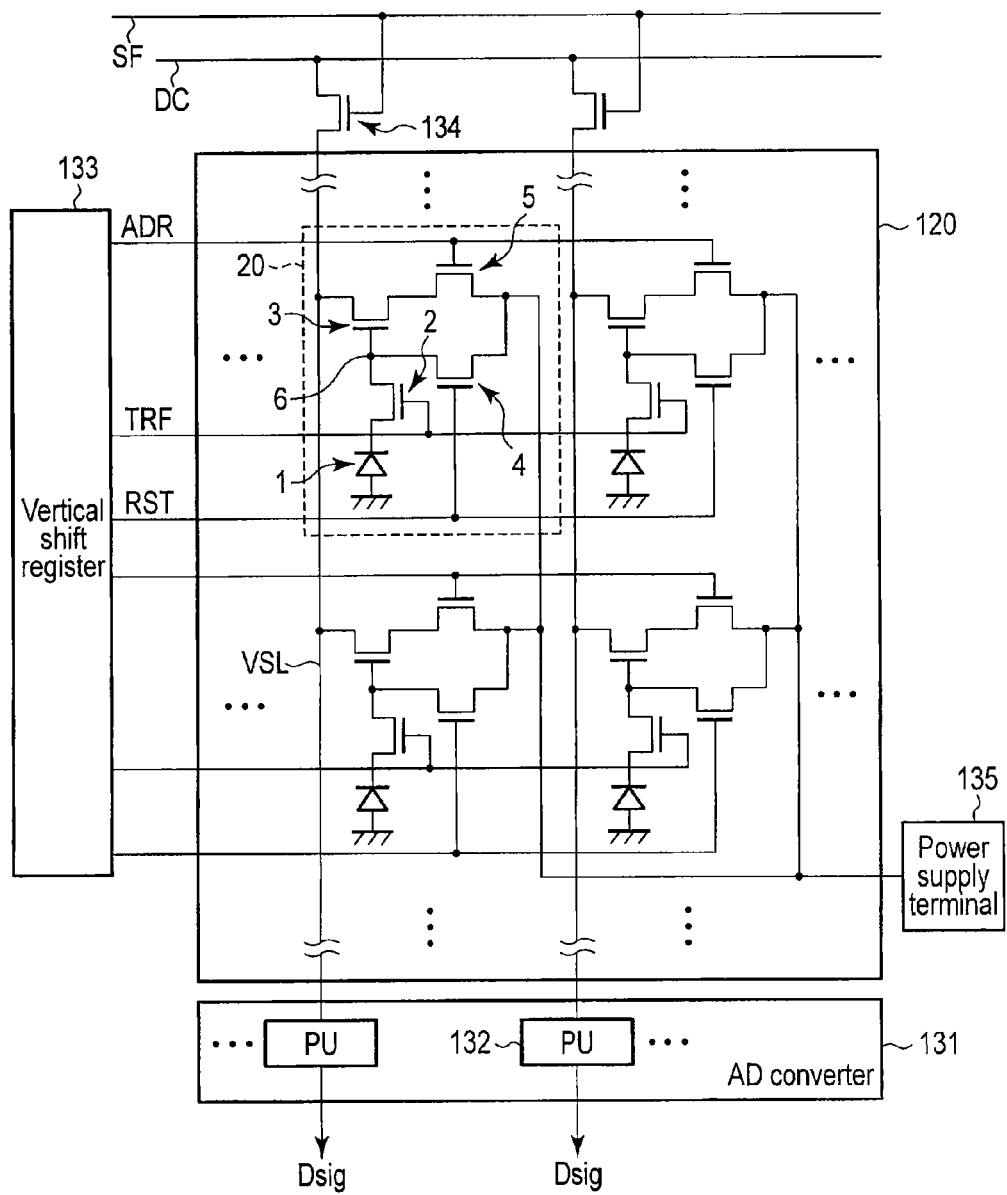
FIG. 5 is an equivalent circuit diagram showing a structure example of a pixel array of the solid-state image sensing device.

For example, circuits such as the AD converter 131 and the vertical shift register 133 in FIG. 5 are provided in peripheral circuit regions 125A and 125B.

Peripheral circuit regions 125A and 125B are electrically isolated from the pixel array 120, for example, by the element isolation region 9B. For example, an element isolation insulating film 99 having an STI structure is embedded in the element isolation region 9B for separating peripheral circuit regions 125A and 125B, and element isolation impurity layers 31b and 98 are provided in the element isolation region 9B.

For example, when peripheral circuit region 125A is an analog circuit region, a P-type impurity region (P-type region) 31A is provided in the semiconductor substrate 30 of the analog circuit region 125A. For example, the P-type region 31A is connected to a metal layer (not shown) to which a ground potential is applied. For example, when peripheral circuit region 125B is a logic circuit region, an N-type impurity region (hereinafter represented as an N-type region) 32 is provided in the semiconductor substrate 30 of the logic circuit region 125B. In the logic circuit region 125B, a P-type region 31B is provided to surround the periphery of the N-type region 32. The P-type regions 31A and 31B of peripheral circuit regions 125A and 125B are formed to reach the second surface of the semiconductor substrate 30 from the first surface.

P-type and N-type well regions 39 are respectively provided in the P-type region 31 of the analog circuit region 125A and the N-type region 32 of the logic circuit region 125B. Components of the peripheral circuit of the image sensor 100, such as a field effect transistor, a resistive element, and a capacitive element are provided in the well region 39. In FIG. 4, a field effect transistor 7 as the component of the peripheral circuit is shown.

In the analog and logic circuit regions 125A and 125B, the field effect transistor (for example, a MOS transistor) 7 is provided in the well region 39. Two impurity layers (diffusion layers) 73 as the source/drain of the transistor 7 are provided in the well region 39. A gate electrode 72 is provided on the surface of the well region 39 between the two diffusion layers 73 via a gate insulating film 71. The well region 39 between the two diffusion layers 73 serves as a channel region of the transistor. Whether the field effect transistor 7 is a P-channel-type or N-channel-type or is an enhancement type or a depression type depends on the conductivity type of the well region 39 in which the field effect transistor 7 is provided or on the conductivity type of the impurity regions (diffusion layers) 73 as the source/drain.

Although the P-type region 31A in the analog circuit region 125A and the N-type region 32 in the logic circuit region 125B are shown in the example described above, the analog circuit region 125A may include the N-type region, and the logic circuit region 125B may include the P-type region.

A plurality of interlayer insulating films 90 are stacked on the semiconductor substrate 30 to cover the upper surfaces (the surface shield layer 11) of the gate electrodes 22 and 72 of the transistors 2 and 7 and the photodiode 1. For example, a silicon oxide film is used for the interlayer insulating films 90.

A multilayer interconnection technique is used for the image sensor 100 according to the present embodiment. That is, a plurality of conductive layers 91 are provided in each of the stacked interlayer insulating films 90 in accordance with each interconnect level (height based on the surface of the substrate). By plugs 92 that are respectively embedded in the interlayer insulating films 90, the conductive layers 91 are electrically connected to other conductive layers located at upper or lower interconnect levels. The conductive layers 91 are metal layers containing, for example, copper (Cu) or aluminum (Al). For example, the conductive layer 91 made of copper (or a copper alloy) has a damascene structure, and is embedded in a trench formed in the interlayer insulating film 90.

For example, terminals of the elements formed on the gate electrodes 22 and 72 of the transistors 2 and 7, the source/drain 73, and the semiconductor substrate 30 are connected, via the contact plug 92, to the conductive layer (interconnect, wiring line) 91 located at a first (lowermost) interconnect level from the side of the semiconductor substrate 30. When the conductive layer 91 in each of the interlayer insulating films 90 is connected to the conductive layer 91 of the upper (or lower) interconnect level via the contact plug 92, the elements provided on the semiconductor substrate 30 are connected to one another. Consequently, a plurality of circuits included in the image sensor 100 are formed.

In addition to the interconnection that connects the elements and connects the circuits, the conductive layer 91 includes a dummy layer which is not connected to the elements and the circuits, and a light blocking film which prevents light from entering the photodiode.

A support substrate 85 is provided on the uppermost interlayer insulating film 90. The support substrate 85 is stacked on the interlayer insulating films 90, for example, via an adhesive layer (protective layer, planarizing layer) 88. For example, a silicon substrate or an insulating substrate is used for the support substrate 85. The support substrate 85 supports the back-side illumination image sensor 100.

An interconnect (not shown) formed by a redistribution layer technique may be provided between the support substrate 85 and the interlayer insulating films 90. The interconnect formed by the redistribution layer technique is hereinafter referred to as a redistribution layer.

Here, in the present embodiment, a surface in which elements are formed, more specifically, the surface (first surface) of the semiconductor substrate 30 in which the gate electrodes 22 and 72 of the transistors 2 and 7 are provided is referred to as a front surface of the semiconductor substrate 30. The interlayer insulating films 90 formed by the multilayer interconnection technique are provided on the front surface of the semiconductor substrate 30. In the present embodiment, the surface (second surface) of the semiconductor substrate 30 opposite to the front surface is referred to as a back surface (rear surface) of the semiconductor substrate 30. FIG. 3 schematically shows the planar structure of the image sensor when viewed from the back side (rear side). The front surface and back surface of the semiconductor substrate 30 are referred to as a main surface when not distinguished from each other.

In the present embodiment, a color filter layer CF is provided on the back surface of the semiconductor substrate 30 via a planarizing layer 89, as shown in FIG. 4. The planarizing layer 89 is an insulating film having functions as a protective layer and an adhesive layer.

The color filter layer CF is provided at a position overlapping the pixel array 120 in a direction perpendicular to the main surface (the front surface and the back surface) of the semiconductor substrate 30. For example, a single pixel array 120 acquires pieces of color information in a single-plate image sensor. In this case, for one pixel (photodiode 1), the color filter layer CF includes, for example, a filter (also referred to as a dye film) which transmits light having a wavelength band corresponding to red (R), a filter which transmits light having a wavelength band corresponding to green (G), and a filter which transmits light having a wavelength band corresponding to blue (B). These filters are provided in the color filter layer CF so that one of the red, blue, and green filters corresponds to one photodiode 1 (or unit cell 20).

The filters in the color filter layer CF are arranged with a predetermined pattern. The color filter layer CF may have a filter which transmits light having a wavelength band corresponding to yellow (Y) or a white (W) filter that transmits all visible light wavelength bands in addition to the red, green, and blue. The color filter layer CF has a predetermined arrangement pattern such as a bayer arrangement or a WRGB arrangement.

The microlens array ML is mounted on the color filter layer CF via the protective layer (not shown) and the adhesive layer (not shown).

The microlens array ML is provided above the pixel array 120 via the color filter layer CF in a direction perpendicular to the main surface of the semiconductor substrate 30. The microlens array ML is formed so that microlenses each corresponding to one pixel (photodiode 1) are two-dimensionally arranged. Each microlens collects incident light to each photodiode 1. The adhesive layer/protective layer (planarizing layer 89) for attaching the microlens ML and the color filter layer CF have the property of transmitting the incident light.

The surface to which the microlens array ML is attached is the back surface of the semiconductor substrate 30. The semiconductor substrate 30 in which the elements are formed intervenes between the interlayer insulating film 90 and the microlens array ML. Thus, in the image sensor 100 according to the present embodiment, the microlens array ML and the color filter layer CF are provided on the surface (back surface) opposite to the surface (front surface) in which the gate electrodes 22 and 72 of the transistors 2 and 7 and the interlayer insulating film 90 are provided. The light from the subject is applied to the pixel array 120 from the back surface of the semiconductor substrate 30 via the microlens array ML and the color filter layer CF.

An image sensor, such as the image sensor 100 according to the present embodiment, having a structure in which light from the back surface opposite to the front surface of the semiconductor substrate 30 where the elements are formed is applied to the photodiodes is referred to as a back-side illumination image sensor.

For example, a light blocking film 81X covering a unit cell 20X is provided on the back side of the semiconductor substrate 30. A region 129 covered by the light blocking film 81X in the pixel array 120 is an optical black region (hereinafter represented as an OB region or a light-blocked region) 129. The unit cell 20X in the OB region 129 generates a reference potential applied to the power supply terminal 135 in FIG. 5, or a potential (or current) for correcting a dark current in the unit cell 20 in the effective region 121. A region 121 other than the OB region 129 in the pixel array 120 is hereinafter referred to as an effective region 121.

For example, in the OB region 129, a stack film CFX of a plurality of corresponding filters different in color is stacked at a position that vertically overlaps the light blocking film 81X. This improves the performance of light blocking for the OB region 129. When the stack film CFX of the filters is provided in the OB region 129, the light blocking film 81X does not need to be provided in the OB region 129. In the OB region 129, the microlens ML does not need to be formed.

For example, an impurity layer 19 as a shield layer is provided in the semiconductor substrate 30 of the pixel array 120 on the back side of the semiconductor substrate 30. The shield layer (hereinafter referred to as a back surface shield layer) 19 on the back side of the semiconductor substrate 30 inhibits an impurity attributed to the layers 89, 81X, and CF provided between the microlens array ML and the semiconductor substrate 30 from diffusing in the semiconductor substrate 30. This inhibits the deterioration of the characteristics of the components 2, 3, and 6 of the unit cell 20 caused by the impurity from the back side of the substrate 30.

A pad provided on the front side of the semiconductor substrate 30 and pads 81 and 81A provided on the back side of the semiconductor substrate 30 allow signals to be input/output between the image sensor 100 and an external device, or allow a voltage to be supplied to the image sensor 100.

For example, the conductive layer (interconnect) 91 in the uppermost interlayer insulating film 90 or a redistribution layer (not shown) on the uppermost interlayer insulating film 90 or a metal layer (not shown) on (or inside) the support substrate 85 is used as the pad on the front side of the semiconductor substrate 30. The pad provided on the front side of the semiconductor substrate 30 on which the image sensor is formed is hereinafter referred to as a front-side pad. The front-side pad does not need to be provided in the back-side illumination image sensor.

As shown in FIG. 3 and FIG. 4, a plurality of contact regions 180 are provided at the end of the semiconductor substrate 30 (the outer peripheral portion of the semiconductor substrate 30). The contact regions 180 are adjacent to, for example, the pixel array 120 and peripheral circuit regions 125A and 125B. In the example shown in FIG. 3, the contact regions 180 are provided at one end of the semiconductor substrate 30 and the other in a direction in which the pixel array 120 and peripheral circuit regions 125A and 125B are adjacent. However, depending on the layout in the chip of the image sensor 100, the contact regions 180 may be provided at one end of the semiconductor substrate 30 and the other in a direction that intersects with the direction in which the pixel array 120 and peripheral circuit regions 125A and 125B are adjacent, or the contact regions 180 may be provided along the respective sides of the quadrangular chip to surround the pixel array 120 and peripheral circuit regions 125A and 125B.

The contact region 180, 180A includes the P-type or N-type impurity region 31B in the semiconductor substrate 30. When viewed from the direction perpendicular to the main surface of the semiconductor substrate 30, the contact region 180 has a quadrangular planar shape, for example, a rectangular planar shape. In the contact region 180, a through-hole (opening) T1 is formed in the semiconductor substrate 30 through the semiconductor substrate 30 from the front side of the semiconductor substrate 30 toward the back side by a through silicon via (TSV) technique.

A through-electrode (also referred to as a through via) 83 is embedded in the through-hole T1. An insulating film (not shown) is provided on the side surface (sidewall) of the through-hole T1, and the through-electrode 83 is electrically isolated from the semiconductor substrate 30 by the insulating film. The through-electrode 83 is connected to the conductive layer 91 in the interlayer insulating film 90 via the plug 92 in the interlayer insulating film 90. In the image sensor 100 according to the present embodiment, one or more through-electrodes 83 and one or more through-holes are provided in each of the contact regions 180, 180A.

On the back side of the semiconductor substrate 30, one pad 81, 81A is provided to correspond to, for example, one contact region 180. The pad 81, 81A has, for example, a quadrangular planar shape.

One pad 81, 81A is connected to one or more through-electrodes 83 provided in the contact region 180, 180A. An insulating film (not shown) is provided between the pad 81, 81A and the back side of the semiconductor substrate 30. The pad 81, 81A is electrically isolated from the semiconductor substrate 30 by the insulating film.

The pad 81, 81A is connected to the conductive layer (interconnect 91) on the front side of the semiconductor substrate 30 via the through-electrode 83 and the plug 92 in the interlayer insulating film 90. The pad 81, 81A provided on the back side of the semiconductor substrate on which the image sensor is formed is hereinafter referred to as a back-side pad 81, 81A.

The planar shape of the back-side pad 81, 81A may be foursquare or rectangular. The planar shape of the back-side pad 81, 81A may otherwise be a quadrangle without corners.

For example, a power supply pad for applying a drive voltage Vdd or a ground voltage Vss to the image sensor, a pad for signal input/output, and a pad connected to a test pin or a monitor pin are used as the front-side pad and back-side pad 81, 81A.

The through-electrode 83 is formed by the use of semiconductor (for example, polysilicon) containing a high-concentration impurity. The back-side pad 81, 81A is formed by the use of a metal layer (for example, aluminum). For example, the back-side pad 81, 81A is formed substantially simultaneously with the light blocking film 81X, and is made of the same material (for example, aluminum or copper) as the light blocking film 81X. The through-electrode 83 may be formed by the use of a metal.

The back-side pads 81, 81A and the contact region 180 are arranged along the sides of the chip 30 of the image sensor 100. The direction in which the back-side pads 81, 81A are arranged on the sides of the chip is hereinafter referred to as a pad arrangement direction.

A guard ring (not shown) is provided in a groove (or through-hole) provided in the semiconductor substrate 30 on the outer periphery of the semiconductor substrate 30, for example, in the contact region 180, 180A. For example, the guard ring is substantially simultaneously formed in the same process as the through-electrode 83. In this case, the guard ring is made of the same material as the through-electrode 83. The guard ring is not connected to, for example, the back-side pads 81, 81A or the plug and interconnect in the interlayer insulating film 90. As long as a short circuit is not caused between the guard ring and the pad (or interconnect, plug), the guard ring may be provided in a region between the pixel array 120 (or peripheral circuit regions 125A and 125B) and the region in the contact region 180 in which the through-electrode 83 is provided, or the guard ring may be provided in a region between the end of the chip (semiconductor substrate) 30 and the region in which the through-electrode 83 is provided, or the guard rings may be provided in both of the above regions.

In the image sensor 100 according to the first embodiment, the back-side pad 81, 81A of the image sensor 100 is different in size (area) and shape from the contact region 180, 180A. In a direction level with the main surface (the front surface or the back surface) of the semiconductor substrate 30 in which the image sensor 100 is formed, the back-side pad 81, 81A of the image sensor 100 extends in a direction (first direction) from the contact region 180 toward the pixel array 120. In a direction that intersects at right angles with the pad arrangement direction in which the pads of the back-side pads 81, 81A are arranged, the back-side pads 81, 81A project toward the pixel array 120 from the contact region 180, i.e., project toward the side opposite to the side on which the back-side pads 81, 81A are provided in a direction level with the front surface of the semiconductor substrate.

In the area of the image sensor 100 within the plane of the semiconductor substrate 30, the contact region 180, 180A is smaller than the back-side pad 81, 81A.

For example, in a direction perpendicular to the main surface of the semiconductor substrate 30, a central position C1 of the back-side pad 81, 81A does not vertically overlap a central position C2 of the contact region 180. In a direction level with the front surface of the semiconductor substrate 30, a dimension D1 of the back-side pad 81 from the central position C2 of the contact formation region 180 to the end on the side of the pixel array 120 is greater than a dimension D2 of the pad 81 from the center C2 of the contact region 180 to the end opposite to the side of the pixel array 120.

The image sensor 100 according to the present embodiment permits the chip size to be smaller than when the pads are laid out on the chip so that the central position of the back-side pad corresponds to the central position of the contact region.

In a direction perpendicular to the main surface of the semiconductor substrate 30, it is preferable that the back-side pad 81 is laid out on the contact region 180 so that the end of the back-side pad 81 opposite to the side of the pixel array 120 vertically overlaps the end of the contact region 180 opposite to the side of the pixel array 120. Thus, the image sensor 100 according to the present embodiment permits the reduction of the distance between the side (end) of the chip and the pad provided along this side, and permits the reduction of the chip size.

In order to reduce both the resistance of the pad and the size of the chip, the end of the back-side pad 81 on the side of the pixel array 120 may be laid out on the chip of the image sensor 100 so that the end of the back-side pad 81 vertically overlaps peripheral circuit regions 125A and 125B via an insulating layer (not shown), in a direction perpendicular to the main surface of the semiconductor substrate 30. The resistance of the back-side pad 81 can be controlled by adjusting the thickness of the pad in addition to the area of the pad.

For example, when the contact region 180 has a rectangular planar shape, the contact region 180 is laid out in the chip (semiconductor substrate) 30 so that the longitudinal direction of the rectangular contact region 180 intersects with the direction from the contact region 180 toward the pixel array 120. For example, on each side of the chip, the longitudinal direction of the rectangular contact region 180 is parallel to the pad arrangement direction (the side of the chip).

When the contact region 180 has a rectangular planar shape and when the back-side pad 81, 81A has a rectangular planar shape, the back-side pad 81, 81A and the contact region 180, 180A may be laid out in the chip 30 so that the longitudinal direction of the rectangular back-side pad 81, 81A intersects with the longitudinal direction of the rectangular contact region 180. However, depending on the layout of the back-side pad and the contact region in the chip, the back-side pad 81, 81A and the contact region 180, 180A may be laid out in the chip 30 of the image sensor so that the longitudinal direction of the rectangular back-side pad 81, 81A is parallel to the longitudinal direction of the rectangular contact region 180, regarding the back-side pads and any one of the pads of the contact regions.

For example, different electrical characteristics are required in the pads used in the image sensor 100. The pads used in the image sensor 100 include pads which may have a high resistance (first interconnect resistance) between the pad and the element, and pads which preferably have a low resistance (second interconnect resistance) between the pad and the element (circuit). The pads which preferably have a low resistance are, for example, a power supply pad to which the drive voltage Vdd or the ground voltage Vss are applied, and a pad for signal input/output. The pads which may have a high resistance are, for example, pads to which the test pin and the monitor pin are connected.

For example, in the image sensor 100 according to the present embodiment, the number of through-electrodes 83 connected to the back-side pads 81A which may have a high resistance is smaller than the number of through-electrodes 83 connected to the back-side pads 81 which preferably have a low resistance. In this case, the number of through-holes T1 in the contact regions 180A corresponding to the back-side pads 81A which may have a high resistance can be smaller than the number of through-holes T1 in the contact regions 180 corresponding to the back-side pads 81 which preferably have a low resistance.

As a result, because of the reduction in number of the through-electrodes 83 and the through-holes T1, the size of the contact regions 180A corresponding to the back-side pads 81A which may have a high resistance can be smaller than the size of the contact regions 180 corresponding to the back-side pads 81 which preferably have a low resistance. Moreover, because of the size reduction of the contact regions 180, the back-side pads 81A which may have a high resistance can be smaller than the back-side pads 81 which preferably have a low resistance.

As long as the required electrical characteristics are fulfilled, even the back-side pads having the same electrical characteristics required in the image sensor may differ in the shape/layout of the contact region 180, 180A and in the arrangement direction/layout of the through-electrodes 83 in the contact region 180, 180A depending on the layout in the chip.

Thus, in the image sensor 100 according to the present embodiment, the number of through-electrodes 83 connected to the back-side pads 81, 81A differ by the pads 81, 81A depending on the electrical characteristics required in the back-side pads 81, 81A.

According to the present embodiment, the contact regions 180, 180A and the back-side pads 81, 81A can be nonuniform in size (shape) so that the contact regions 180, 180A and the back-side pads 81, 81A deferring in size depending on the electrical characteristics of the pads are provided on the back side of the semiconductor substrate 30. Therefore, the image sensor 100 according to the present embodiment includes the contact regions 180 and the back-side pads 81 having a given size (first size), and the contact regions 180A and the back-side pads 81A having a size (second size) smaller than the former given size, in accordance with the electrical characteristics of the pads.

In addition, some of the contact regions and the back-side pads according to the present embodiment have only to be different in size, and not all the contact regions and the back-side pads have to be different in size. That is, some of the contact regions and the back-side pads may have the same size. The same applies to the number of through-electrodes in the contact region.

In the image sensor 100 according to the present embodiment, the relative positions of the back-side pads 81, 81A and the contact regions 180, 180A are adjusted, and the sizes of the contact regions 180, 180A corresponding to the electrical characteristics of the back-side pads 81, 81A are reduced. Thus, the layout of the contact regions 180, 180A in the chip 30 of the image sensor 100 is adjusted. As a result, the image sensor 100 according to the present embodiment permits the efficient arrangement of the back-side pads 81, 81A.

In a general image sensor, back-side pads and contact regions (through-electrodes) have substantially the same shape (area) and layout, and the pads and contact regions are laid out in a chip so that the center of the position where the back-side pad is formed overlaps the central position of the contact formation region. The contact regions in the general image sensor are formed to have the same size (area), and the pads are also formed to have the same size. In an image sensor, one through-electrode is provided for one back-side pad in the contact region.

In the image sensor 100 according to the present embodiment described above, the back-side pads 81, 81A and the contact regions 180, 180A differ in shape and size, and the number of through-electrodes 83 connected to the back-side pads 81, 81A is adjusted in accordance with the electrical characteristics of the pads. Thus, the pads 81, 81A and the contact regions 180, 180A can be reduced in size as compared with the general image sensor.

Therefore, in the image sensor 100 according to the present embodiment, the chip size of the image sensor can be reduced by the reduction of the areas occupied by the contact regions 180, 180A and the back-side pads 81, 81A. Accordingly, the module including the image sensor 100 according to the present embodiment can also be reduced in size. Moreover, in the present embodiment, the chip size of the image sensor can be reduced, so that manufacturing costs (for example, chip costs) of the image sensor can be reduced.

Furthermore, in the image sensor 100 according to the present embodiment, the area occupied by the pixel array 120 or peripheral circuits 125A and 125B can be increased in the same chip size by the reduction of the areas occupied by the contact regions 180, 180A and the back-side pads 81, 81A.

As described above, the solid-state image sensing device (image sensor and module) according to the first embodiment can be reduced in size.

(b) Manufacturing Method

A method of manufacturing the solid-state image sensing device (e.g., a back-side illumination image sensor) according to the present embodiment is described with reference to FIG. 6 to FIG. 12.

FIG. 6 to FIG. 12 show the sectional process views in the steps of the back-side illumination image sensor manufacturing method according to the present embodiment. FIG. 6 to FIG. 12 show the steps of the manufacturing method in a section taken along the line A-A in FIG. 3. Here, FIG. 1 to FIG. 4 are also properly used in addition to FIG. 6 to FIG. 12 to describe the steps of the back-side illumination image sensor manufacturing method according to the present embodiment. In the method of manufacturing the image sensor according to the present embodiment, the order of the formation of the components described later may be properly changed as long as process consistency is ensured.

Figure 6:
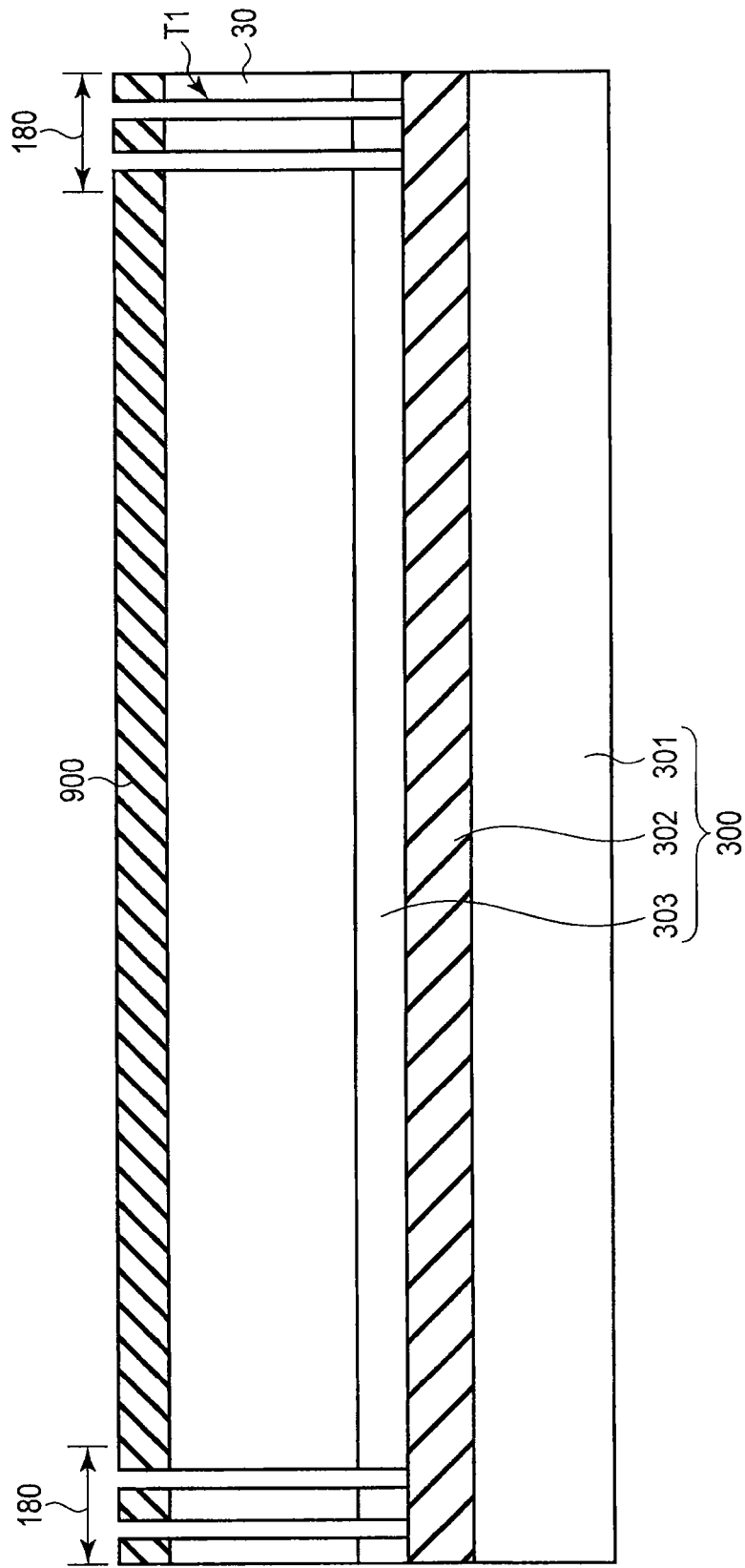
FIG. 6 is a view illustrating a step in a method of manufacturing the solid-state image sensing device according to the first embodiment.

As shown in FIG. 6, a semiconductor layer 30 is formed on a substrate 300. For example, the substrate 300 is an SOI substrate 300. The SOI substrate 300 includes a buried oxide (BOX) layer 302 as an insulating layer on a semiconductor substrate (for example, a silicon substrate) 301, and a silicon-on-insulator (SOI) layer 303 on the BOX layer 302. The SOI layer 303 is a crystal layer (epitaxial layer) having a thickness of about 50 nm to 100 nm. The SOI layer 303 contains an N-type dopant having an impurity concentration of about $10^{15}$ to $10^{17}$ cm$^{-3}$.

The semiconductor layer 30 is formed on the SOI layer 303. The semiconductor layer 30 is an N-type epitaxial layer. The epitaxial layer 30 on the SOI layer 303 is formed to have a thickness of 3 μm to 8 μm. The epitaxial layer 30 is formed to have an N-type dopant impurity concentration of about $10^{14}$ to $10^{17}$ cm$^{-3}$.

The epitaxial layer 30 on the SOI layer 303 is used as the semiconductor substrate 30 to form the image sensor 100 according to the present embodiment.

A silicon oxide film (not shown) is formed on the epitaxial layer 30, for example, by a CVD method. A silicon nitride film (not shown) is formed on the silicon oxide film of the epitaxial layer 30, for example, by the CVD method. A hard mask layer including the stack of the silicon oxide film and the silicon nitride film is formed on the epitaxial layer 30.

A resist film 900 is applied to the top of the silicon nitride film as the hard mask layer. An opening to expose the epitaxial layer 30 is formed in the resist film 900 by photolithography and etching. The opening of the resist film 900 is formed at the position where a via hole (through-hole) is formed to pass through the epitaxial layer 30 from the front surface to the back surface. In addition, an opening is formed in the resist film at the position where a guard ring is formed.

The resist film 900 having the opening formed therein is used as a mask to form, in the epitaxial layer 30, a trench T1 serving as a through-hole in which to embed a through-electrode, and a trench in which to embed the guard ring, in such a manner as to reach the BOX layer 302 or the SOI layer 303. For example, the trench T1 is formed through the SOI layer 303, and the upper surface of the BOX layer 302 is exposed at the position where the trench T1 is formed.

Figure 7:
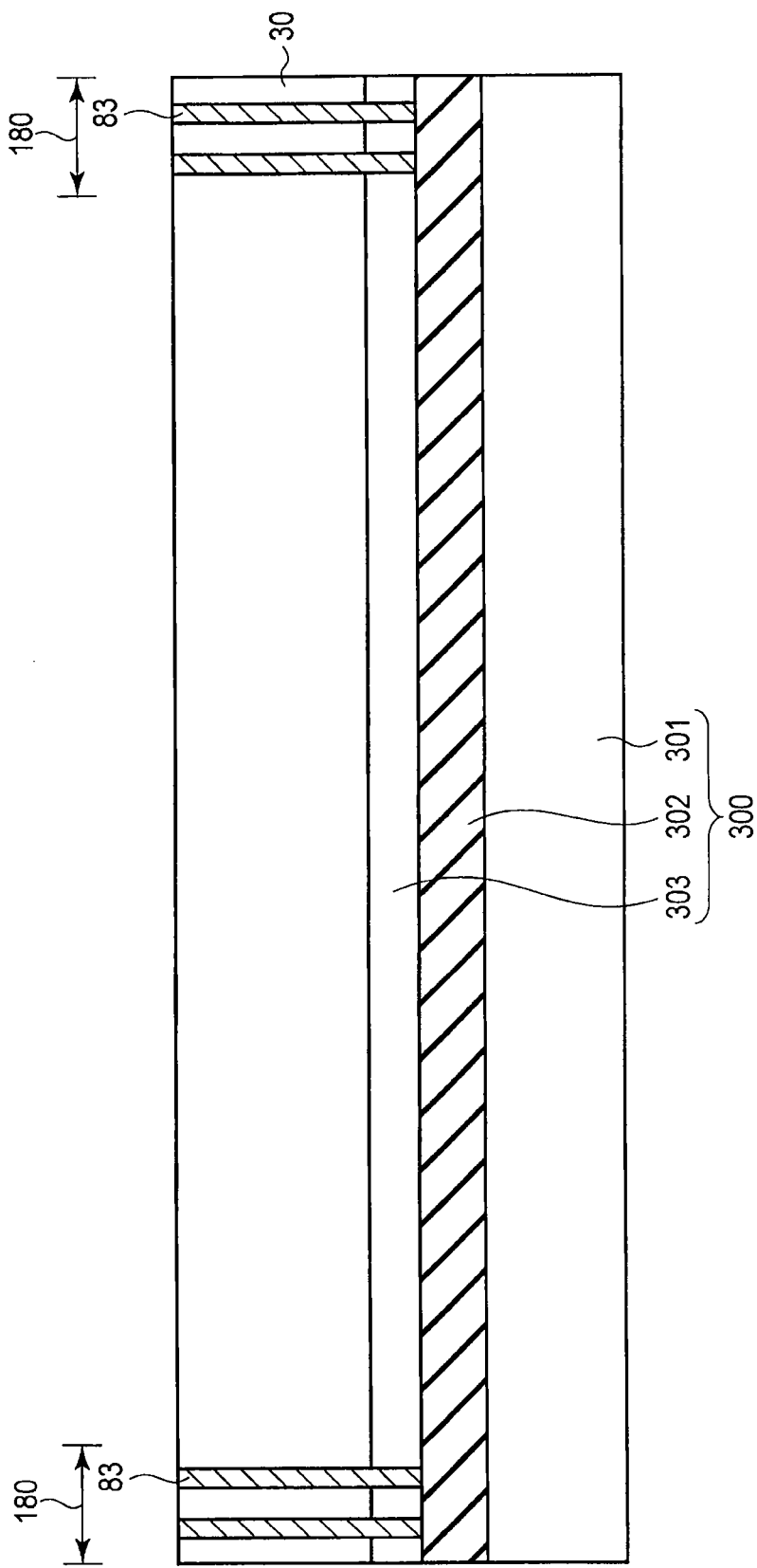
FIG. 7 is a view illustrating a step in the method of manufacturing the solid-state image sensing device according to the first embodiment.

As shown in FIG. 7, after the removal of the resist film, the epitaxial layer 30 and the SOI layer 303 exposed in the formed trench (through-hole) T1 are oxidized, and an oxide film (not shown) is formed on the inner surface (sidewall) of the trench T1 in the epitaxial layer 30 and the SOI layer 303. The silicon nitride film is deposited, for example, by the CVD method on the inner surface of the trench T1 in the epitaxial layer 30 and the SOI layer 303 so that the silicon nitride film does not fill the trench. The silicon nitride film may be formed by nitriding.

A polysilicon layer 83 doped with a high concentration of an impurity is embedded in the trench T1 in the epitaxial layer 30 and the SOI layer 303, for example, by the CVD method and a chemical mechanical polishing (CMP) method.

A conductor 83 to be a through-electrode which reaches the back side of the epitaxial layer (semiconductor substrate) 30 from the front side is formed in the trench (through-hole) T1 of the epitaxial layer 30 and the SOI layer 303 by the steps shown in FIG. 6 and FIG. 7.

For example, the number of trenches and conductors 83 formed in the contact region 180 is adjusted in accordance with the function and preferable electrical characteristics of the pads provided in the contact region 180. In this case, a different number of trenches (through-holes) T1 and the conductors (through-electrodes) 83 are formed in each contact region 180 so that the number of through-holes and conductors 83 connected to the pads which may have a high resistance is smaller than the number of through-holes and conductors 83 connected to the pads which preferably have a low resistance. For example, the area of the contact region in which a given number of through-holes are formed is smaller than the area of the contact region in which a greater number of through-holes are formed than in the former contact region.

For example, the trench T1 and the conductor 83 are laid out in the contact region 180 so that the contact region 180 has a rectangular planar shape. Regarding the rectangular contact region 180, the contact region 180 is laid out in the substrate 300 so that the longitudinal direction of the contact region 180 is parallel to the pad arrangement direction on each side of the chip.

Figure 8:
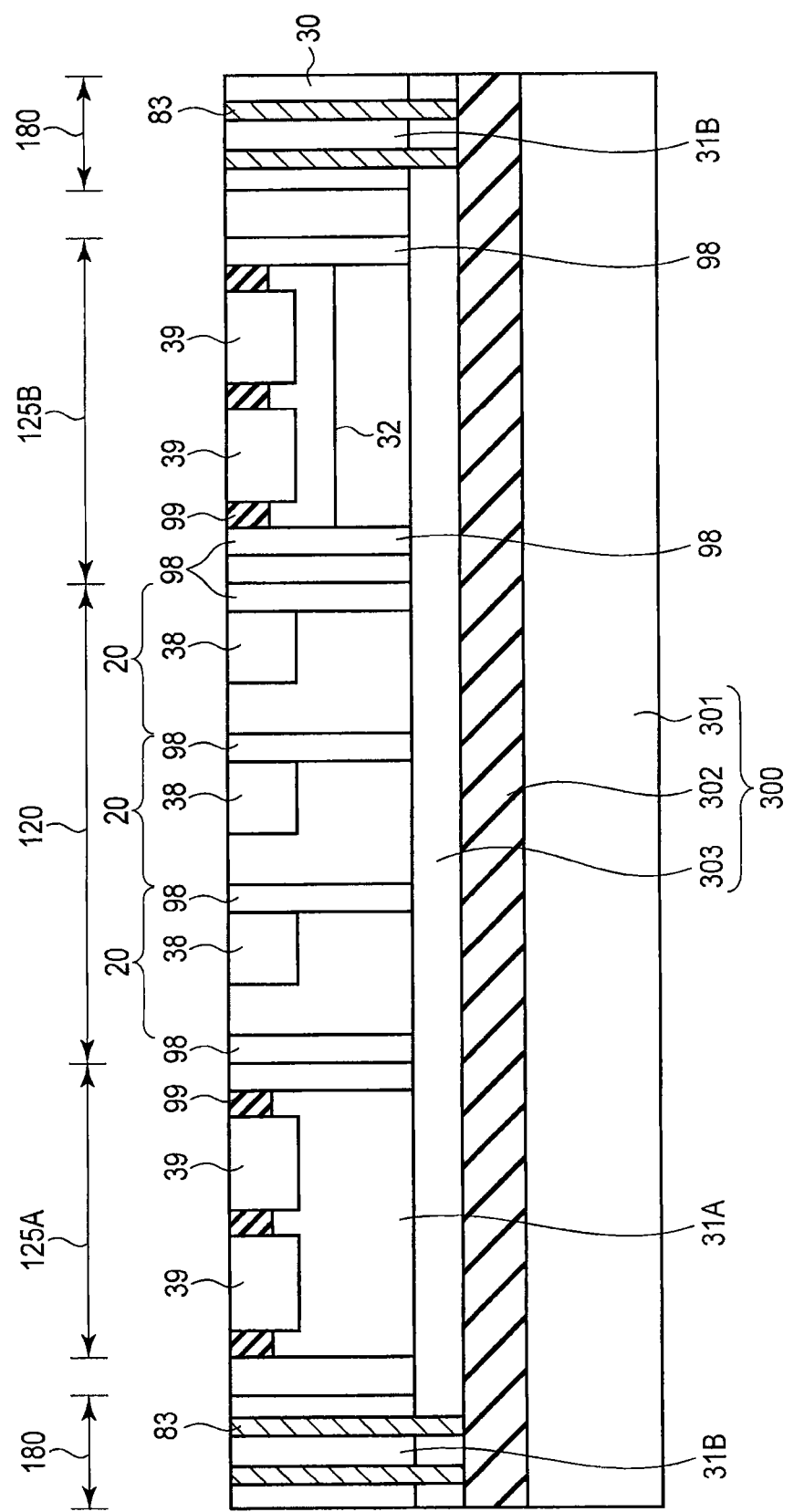
FIG. 8 is a view illustrating a step in the method of manufacturing the solid-state image sensing device according to the first embodiment.

As shown in FIG. 8, an element isolation trench is formed in a predetermined region within the epitaxial layer 30 by photolithography and reactive ion etching (RIE). An insulator is embedded in the element isolation trench by the chemical vapor deposition (CVD) method or a coating method. As a result, an element isolation insulating film 99 having a shallow trench isolation (STI) structure is formed at a predetermined position in the epitaxial layer 30. For example, the element isolation insulating film 99 is formed on the boundary between an N-type impurity region (for example, an N-type well region) and a P-type impurity region (for example, a P-type well region) in peripheral circuit regions 125A and 125B formed in a subsequent step, and in the pixel array 120.

Impurity regions 31A, 31B, and 98 are sequentially formed in the epitaxial layer 30 by ion implantation that uses a resist film (not shown) as a mask.

For example, in the N-type epitaxial layer 30, P-type impurity semiconductor regions (P-type regions) 31A and 98 are formed at positions corresponding to a predetermined element formation region and an element isolation region by ion implantation that uses a resist film having an opening as a mask. The P-type regions 31A and 98 are used as element formation regions or element isolation impurity regions in the pixel array 120 and peripheral circuit regions 125A and 125B.

For example, the P-type region 31B is formed in the contact region 180 of the image sensor simultaneously with the formation of the P-type regions 31A and 98 in the element formation regions and the element isolation regions. The contact region 180 may be an N-type region.

For example, the acceleration energy of ions in the ion implantation is set to about 100 keV to 3 MeV. However, the upper limit of the acceleration energy is properly changed by the performance of an ion implanter, productivity, and process. The ion acceleration energy is preferably set to 3 MeV or less. For example, the P-type impurity regions 31A, 31B, and 98 are formed to have an impurity concentration of about $10^{15}$ $cm^{-3}$ to $10^{17}$ $cm^{-3}$.

After the P-type regions 31A, 31B, and 98 are formed and the mask for forming the P-type regions 31A, 31B, and 98 is removed, another resist film (not shown) having openings at positions corresponding to the predetermined element formation region and the element isolation region is formed on the epitaxial layer 30. The openings of the resist film are formed at the position corresponding to the region where the N-type impurity region (N-type region) is formed.

The resist film having the openings is used to form an N-type region 32 in peripheral circuit regions 125A and 125B by ion implantation.

A P-type or N-type well region 39 is then properly formed in the P-type or N-type regions 31A and 32A in which elements are formed, by ion implantation that uses the resist film as a mask.

In this step, for example, simultaneously with the formation of the P-type well region, a P-type region (well region) 38 is formed, by ion implantation that uses the resist film as a mask, in the epitaxial layer 30 in the region (cell formation region) 20 surrounded by the P-type element isolation impurity layer in the pixel array 120.

In this way, the element isolation insulating film 99 and the element isolation impurity layer 98 which electrically isolate adjacent elements are formed in the semiconductor layer 30 by the step shown in FIG. 8. The pixel array 120 and peripheral circuit regions 125A and 125B are marked out in the semiconductor layer 30 on the SOI substrate 300. The P-type or N-type regions 31A, 32A, 38, and 39 are formed in the element formation regions of the pixel array 120 and peripheral circuit regions 125A and 125B. A cell formation region 20 is formed in the pixel array 120.

After the P-type and N-type regions 31A, 31B, 32, 38, 39, and 98 are formed, the element isolation insulating film 99 may be formed in the semiconductor layer 30.

As shown in FIG. 9, an element including the image sensor is formed in the cell formation region 20 of the pixel array 120 and in the well regions 38 and 39 of peripheral circuit regions 125A and 125B.

Gate insulating films 21 and 71 of transistors 2 and 7 are formed on the exposed surface of the epitaxial layer 30, for example, by the oxidizing of the epitaxial layer 30. A polysilicon layer is deposited on the formed gate insulating films 21 and 71 by the CVD method. The polysilicon layer is then fabricated by photolithography and the RIE method, and the gate electrodes 22 and 72 having a predetermined gate length and a predetermined gate width are formed on the surface (first surface) of the epitaxial layer 30 across the gate insulating films 51 and 71.

For example, in the pixel array 120, the formed gate electrode 22 and resist film (not shown) are used as masks, and the N-type impurity layer (N-type region) 10 of the photodiode 1 is formed in the cell formation region 20 by the ion implantation method. In the surface layer of the formed N-type impurity layer 10, a P-type impurity layer 11 as a surface shield layer is formed by ion implantation. In the P-type well region 38 within the cell formation region 20, an N-type impurity layer 60 as a floating diffusion and an N-type region (not shown) as the source/drain of the transistor (for example, a transfer gate) 2 are formed.

While the components 1, 2, and 6 of the unit cell are formed in the pixel array 120, peripheral circuit regions 125A and 125B are covered by the resist film (not shown).

In the region (N-type or P-type well region) 39 in which the transistor 7 is formed in peripheral circuit regions 125A and 125B, a P-type or N-type impurity layer as the source/drain of the transistor 7 is formed in the epitaxial layer 30 by ion implantation that uses the gate electrode 72 as a mask.

As described above, the photodiode 1 and the field effect transistor 2 that constitute the unit cell 20, and the field effect transistor 7 that constitutes a peripheral circuit are respectively formed in the pixel array 120 and peripheral circuit regions 125A and 125B by the step shown in FIG. 9.

The transistor 2 within the unit cell 20 and the transistor 7 of the peripheral circuit may be formed in a simultaneous step or may be formed in different steps. The transistors 2 and 7 may be formed after the formation of the photodiode 1.

Figure 10:
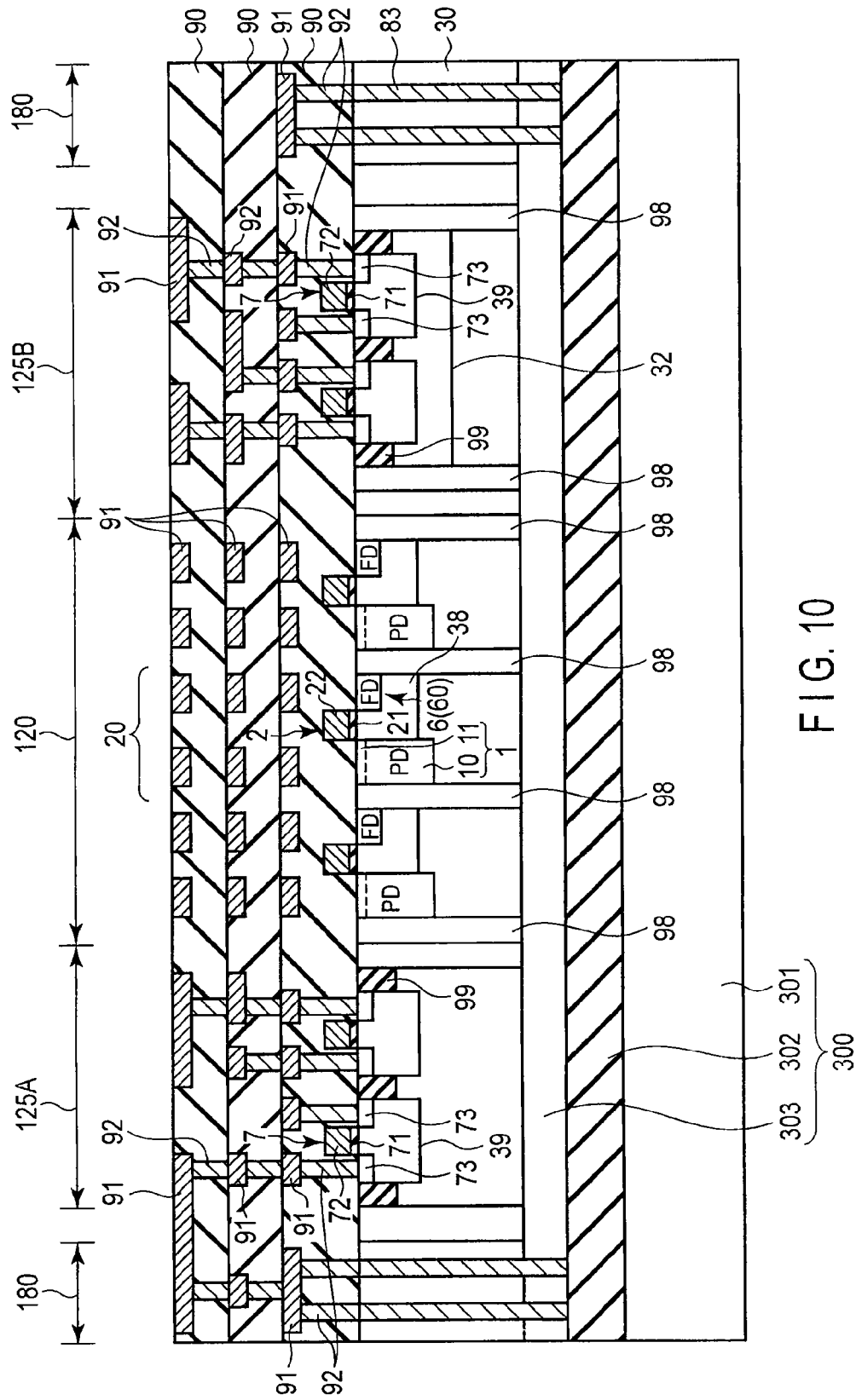
FIG. 10 is a view illustrating a step in the method of manufacturing the solid-state image sensing device according to the first embodiment.

As shown in FIG. 10, an interlayer insulating film (for example, a silicon oxide film) 90 is deposited, for example, by the CVD method on the surface of the epitaxial layer 30 in which the elements 1, 2, and 7 are formed. The interlayer insulating film 90 covers the front side of the epitaxial layer 30, and covers, for example, the gate electrodes 22 and 72 of the transistors 2 and 7.

After the upper surface of the interlayer insulating film 90 is planarized by the CMP method, a contact hole is formed in the interlayer insulating film 90 by photolithography and the RIE method. A contact plug (for example, tungsten or molybdenum) 92 is embedded in the formed contact hole.

For example, a conductive layer of aluminum or copper is deposited on the interlayer insulating film 90 and the contact plug 92 by a sputter method. The deposited conductive layer is fabricated into a predetermined shape to be connected to the contact plug 92 by photolithography and the RIE method. As a result, a conductive layer 91 as an interconnect is formed. Simultaneously with the formation of the conductive layer 91 as the interconnect, a light blocking film and a dummy layer which are made of the same material are formed on the interlayer insulating film 90. For example, the interconnect 91 may be formed by a damascene method.

In the interlayer insulating film 90 covering the front side of the contact region 180, a plug 92 and an interconnect 91 are formed to be connected to the conductor 83 as the through-electrode, simultaneously with the formation of the plug 92 and the interconnect 91 connected to the elements on the front side of the epitaxial layer 30.

In a step substantially similar to the formation of the interconnect of the lowermost interconnect level, the interlayer insulating film 90, the plug (via plug) 92, and the conductive layer (interconnect, light blocking film, or dummy layer) 91 are sequentially formed at the respective interconnect levels by the multilayer interconnection technique. For example, the pad on the front side of the image sensor may be formed by the use of the conductive layer 91 of the uppermost interconnect level.

As a result, the elements 1, 2, and 7 on the epitaxial layer 30 as the semiconductor substrate are connected by the interconnects of the multilayer interconnection technique, and the circuits of the image sensor are formed. Further, the conductor (through-electrode) embedded in the epitaxial layer 30 in the contact region 180 is connected to the conductive layer 91 and the plug 92 in the interlayer insulating film 90.

Figure 11:
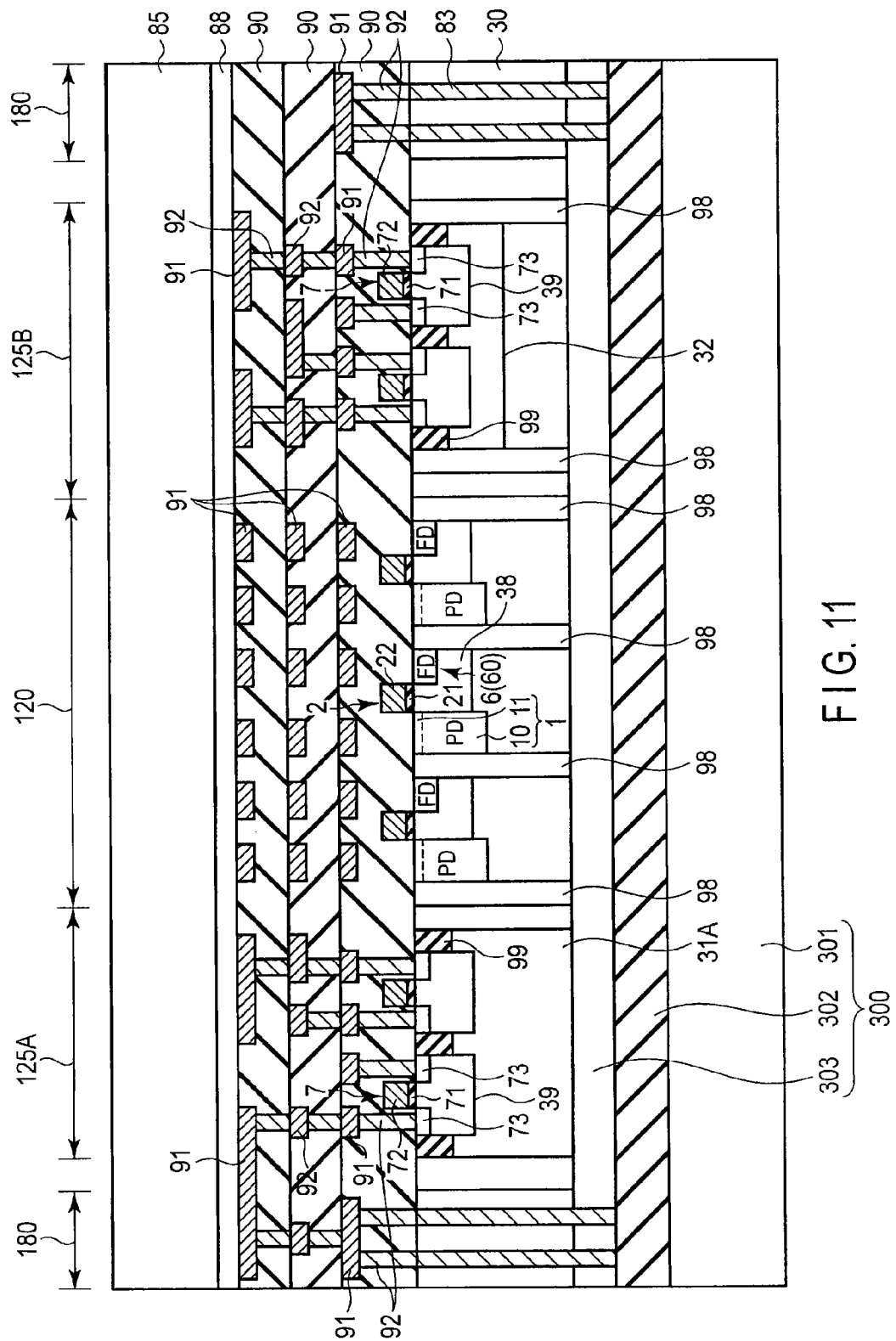
FIG. 11 is a view illustrating a step in the method of manufacturing the solid-state image sensing device according to the first embodiment.

As shown in FIG. 11, after the upper surfaces of the interlayer insulating film 90 and the conductive layer 91 of the uppermost layer on the front side of the epitaxial layer 30 are planarized, for example, by the CMP method, an adhesive layer (for example, a silicon oxide film) 88 is formed on the interlayer insulating film 90 and the conductive layer (the interconnect and the front-side pad) 91 of the uppermost layer. A support substrate 85 is then formed on the adhesive layer 88. For example, the adhesive layer (not shown) formed on the support substrate 85 is attached to the adhesive layer 88 on the interlayer insulating film 90. Thus, the support substrate 85 is bonded to the interlayer insulating film 90 covering the epitaxial layer 30.

For example, before the support substrate 85 is attached to the interlayer insulating film 90, a redistribution layer by the redistribution layer technique may be formed on the uppermost interlayer insulating film 90 to be connected to the interconnect in the interlayer insulating film 90.

Figure 12:
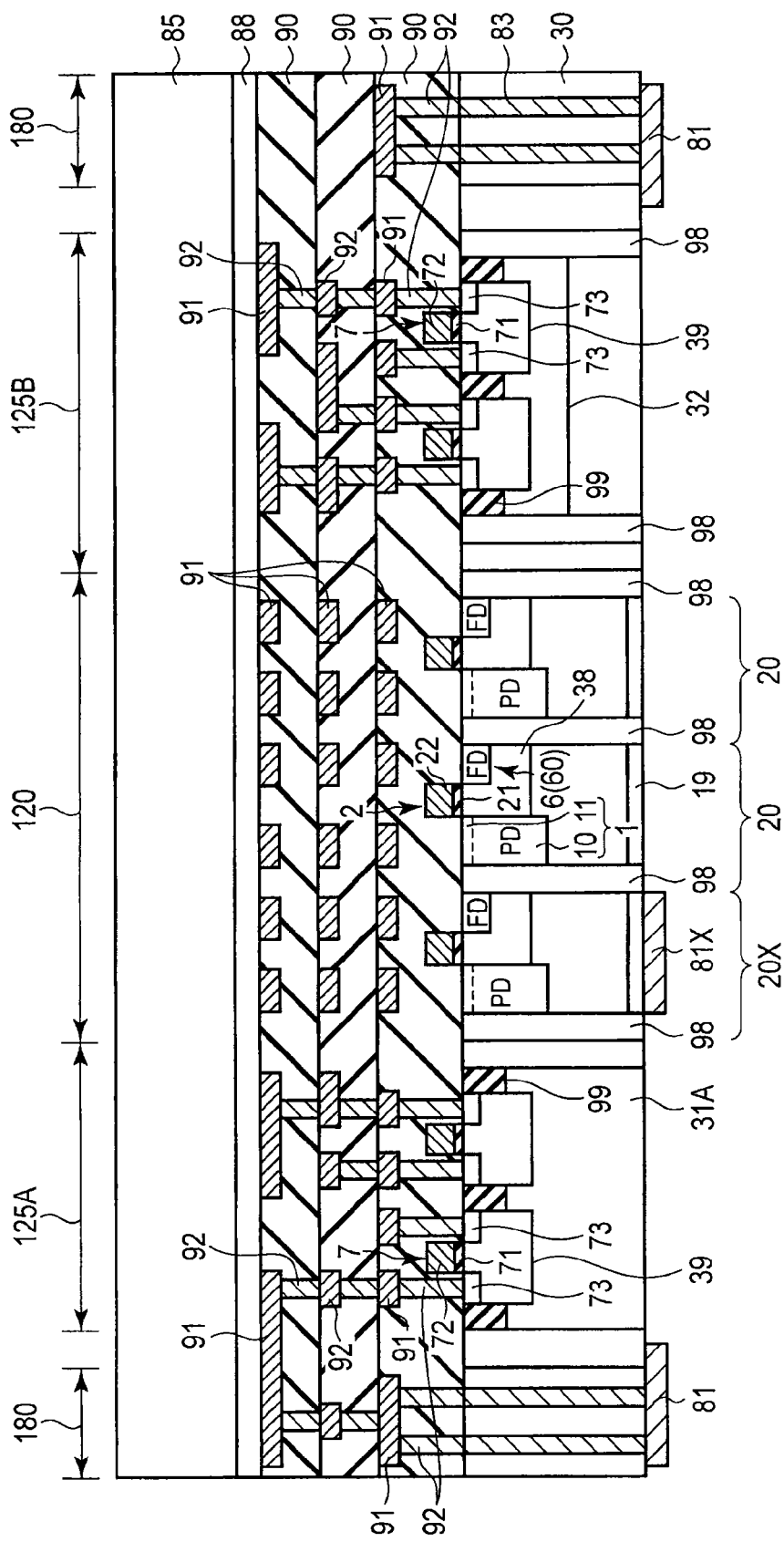
FIG. 12 is a view illustrating a step in the method of manufacturing the solid-state image sensing device according to the first embodiment.

As shown in FIG. 12, after the support substrate 85 is attached to the interlayer insulating film 90, the semiconductor substrate, the BOX layer, and the SOI layer that are included in the SOI substrate are selectively removed, for example, by the CMP method and by wet etching that uses an HF solution, and the semiconductor substrate and the BOX layer are detached from the epitaxial layer 30. As a result, the back surface of the epitaxial layer 30 and the conductor 83 embedded in the epitaxial layer 30 are exposed.

On the back side of the exposed epitaxial layer 30, a P-type impurity layer 19 as a shield layer is formed in the epitaxial layer 30 (N-type region) of the cell formation region 20 by ion implantation.

A metal film is deposited on the back surface of the epitaxial layer 30 by the sputter method. The deposited metal film is fabricated into a predetermined shape by photolithography and the RIE method. Thus, in the pixel array 120, a light blocking film (metal film) 81X is formed on the back side of some cell formation regions 20X among the cell formation regions 20 and 20X. An OB region 129 and an effective region are formed in the pixel array 120 by the formation of the cell formation region 20X covered by the light blocking film 81.

Simultaneously with the formation of the light blocking film 81, the pad (back-side pad) 81 made of a metal film is formed on the back side of the contact region 180 to be connected to the conductor (through-electrode) 83 in the epitaxial layer 30.

Before the metal film is deposited on the back surface of the epitaxial layer 30, an insulating film (for example, a silicon oxide film) as a protective film may be formed on the back surface of the epitaxial layer 30, for example, by the CVD method or a thermal oxidation method.

After the light blocking film 81X and the back-side pad 81 are formed on the back side of the epitaxial layer (substrate), a planarizing layer 89 is formed on the back surface of the epitaxial layer 30 to cover the light blocking film 81X and the back-side pad 81, as shown in FIG. 4. The planarizing layer 89 is formed by the use of a stack film including an acrylic resin and a silicon oxide film.

In a direction perpendicular to the main surface of the semiconductor substrate 30, a color filter layer CF having an arrangement pattern of predetermined filters (dye films) is formed on the planarizing layer 89 on the back side at a position that vertically overlaps the pixel array 120. A microlens array ML is formed at a position that vertically overlaps the pixel array 120 across the color filter layer CF.

One filter and one microlens are disposed on the back side of the epitaxial layer 30 to correspond to one unit cell (photodiode) in the pixel array 120. For example, a filter layer CFX in which a plurality of filters (dye films) are stacked may be formed for the unit cell of the OB region 129 to improve light blocking performance. In this case, the light blocking film to form the OB region 129 does not need to be formed.

After an opening is formed in the planarizing layer 89 to expose the back-side pad 81, the chip of the back-side illumination image sensor 100 is mounted on a package substrate such as a lead frame. When the front-side pad is provided in the image sensor, an opening is formed in the support substrate 85 to expose the front-side pad.

The back-side pad 81 and the front-side pad of the image sensor 100 are electrically connected to the interconnect and terminal of the package substrate by bonding wires or solder balls (or solder bumps). As a result, the image sensor 100 is packaged.

As shown in FIG. 2, the packaged image sensor 100 is mounted on a circuit substrate (package substrate) 200, and a lens holder 117 and a shield 119 are attached to the image sensor 100. In this way, a camera module including the back-side illumination image sensor 100 is formed.

In the steps described above, the image sensor 100 according to the present embodiment and the camera module including this image sensor are formed.

Although the SOI substrate 300 is used to form the image sensor in the example shown in the image sensor manufacturing method according to the present embodiment, a bulk substrate (for example, a silicon single crystal substrate) may be used to form the image sensor. When the bulk substrate is used, the time of etching to form a trench (through-hole) is set so that the trench having a desired depth is formed. The back surface of the bulk substrate is ground to reach the trench, and a through-hole that reaches the back surface of the bulk substrate from the front surface is formed. The advantageous effects described above are also obtained when the bulk substrate is used to form the image sensor.

In the case described in the image sensor manufacturing method according to the present embodiment, the unit cell (pixel) and the interlayer insulating film of the image sensor are formed after the formation of the through-electrode in the semiconductor substrate. However, in the image sensor according to the present embodiment, the through-electrode may be formed in the semiconductor substrate after the formation of the unit cell (pixel) and the interlayer insulating film of the image sensor.

In the image sensor manufacturing method according to the present embodiment, the back-side pads 81, 81A of the back-side illumination image sensor and the contact regions 180, 180A where the back-side pads 81, 81A are provided are formed to be different in shape and size.

During the formation of the back-side pad in the image sensor manufacturing method according to the present embodiment, the back-side pads 81, 81A are patterned, in a direction level with the main surface of the epitaxial layer (substrate) 30 (a direction perpendicular to the pad arrangement direction of the pads 81, 81A), to extend in a direction from the contact region 180 toward the pixel array 120. For example, the pads 81, 81A are formed on the contact region 180 so that the central position C1 of the back-side pad 81, 81A does not vertically overlap the central position C2 of the contact region 180 in a direction perpendicular to the main surface of the semiconductor substrate 30.

Moreover, the back-side pads 81, 81A are patterned so that the dimension D1 of the back-side pad 81, 81A from the center C2 of the contact region 180, 180A to the end on the side of the pixel array 120 is greater than the dimension D2 of the pad 81, 81A from the center C2 of the contact region 180, 180A to the end opposite to the side of the pixel array 120 in a direction level with the main surface of the semiconductor substrate 30.

In a direction perpendicular to the main surface of the semiconductor substrate 30, it is preferable that the back-side pad 81, 81A is laid out on the contact region 180 so that the end of the back-side pad 81, 81A on the side (the side of the chip) opposite to the side of the pixel array 120 vertically overlaps the end of the contact region 180 opposite to the side of the pixel array 120. This permits the reduction of the space between the end of the contact region 180 on the side opposite to the pixel array 120 and the end of the chip.

Regarding the pads provided on the back side of the image sensor, the chip size of the image sensor can be reduced by the adjustment of the shape of the pad 81, 81A and the symmetrical layout of the pad 81, 81A and the contact region 180, 180A as in the present embodiment.

Furthermore, the number of through-holes (trenches) and through-electrodes formed in the contact region is adjusted in accordance with the specification of the pad 81, 81A provided in the contact region 180, 180A. For example, the number of through-holes and through-electrodes in the contact region 180A where the pads 81A which may have a high resistance are provided is smaller than the number of through-holes and through-electrodes in the contact region 180 where the pads 81 which preferably have a low resistance are provided. Thus, in the image sensor 100 according to the present embodiment, some of the back-side pads 81, 81A and the contact regions 180, 180A can be reduced in size, and the chip size of the image sensor can be reduced as compared with the image sensor in which all back-side pads and the contact regions have the same size.

As described above, according to the solid-state image sensing device manufacturing method of the first embodiment, the size of the solid-state image sensing device (image sensor or camera module) can be reduced.

(2) Second Embodiment

A solid-state image sensing device (for example, an image sensor) according to the second embodiment is described with reference to FIG. 13 and FIG. 14. In the present embodiment, the same components and functions as those in the first embodiment are described when necessary.

Figure 13:
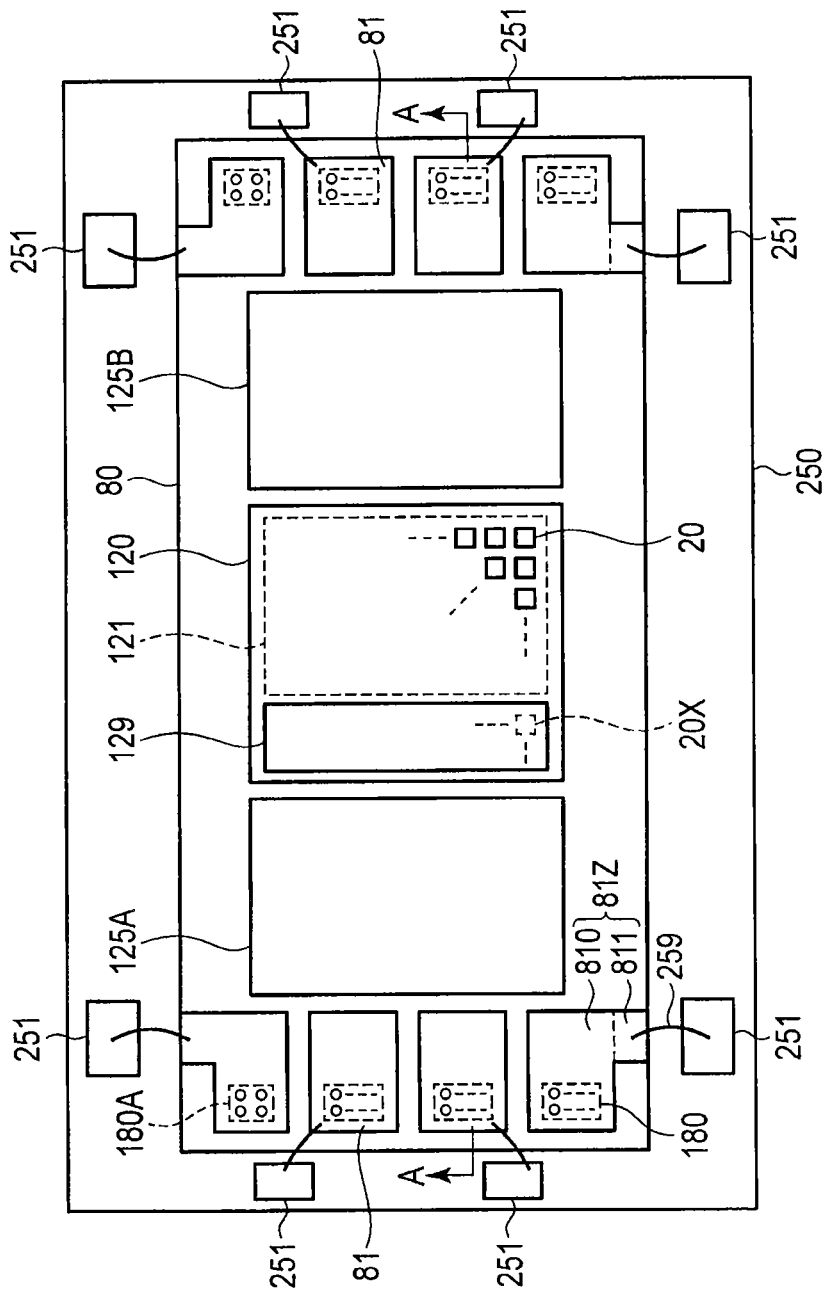
FIG. 13 is a schematic plan view showing a structure example of a solid-state image sensing device according to a second embodiment.
Figure 14:
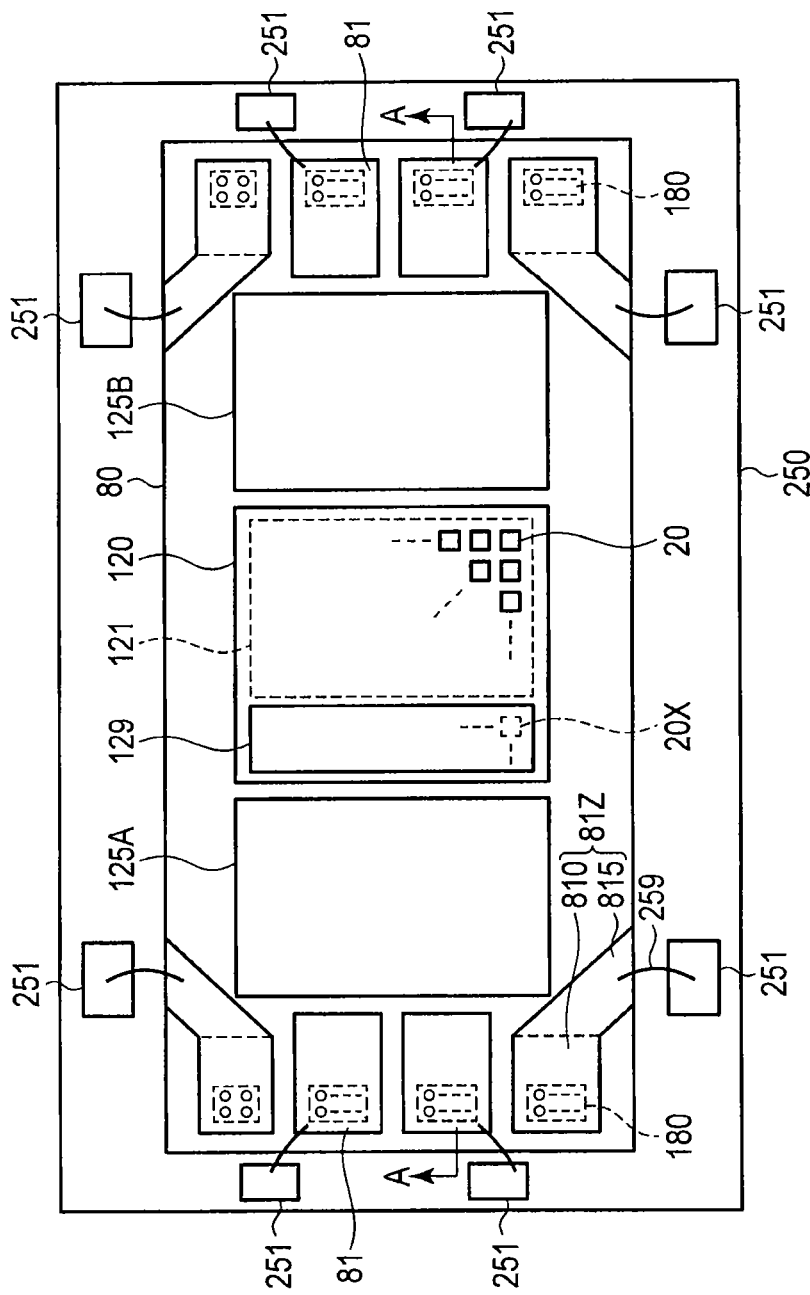
FIG. 14 is a schematic plan view showing a structure example of the solid-state image sensing device according to the second embodiment.

FIG. 13 and FIG. 14 are schematic plan views showing the planar structure of an image sensor 100 according to the present embodiment. In the present embodiment, the sectional structure of the image sensor 100 is substantially the same as the structure shown in FIG. 4 and is therefore not shown.

As shown in FIG. 13, in the image sensor 100 according to the present embodiment, a back-side pad 81Z includes a first portion 810 and a second portion 811. The first portion 810 extends in a direction (first direction) parallel to a direction from a contact region 180 toward a pixel array 120 (direction perpendicular to a pad arrangement direction on the side where the pad is provided). The second portion 811 projects from the first portion 810 in a direction that intersects with the direction from the contact region 180 toward the pixel array 120.

The first portion 810 is in contact with a through-electrode 83 in the contact region 180, and is electrically connected to the through-electrode 83. The second portion 811 is electrically connected to the through-electrode 83 via the first portion 810.

The pad 81Z of the image sensor 100 is connected to a predetermined terminal among terminals (electrodes, interconnects) 251 of a package substrate (for example, a lead frame or BGA) 250 or a circuit substrate (module substrate) on which a chip of the image sensor 100 is mounted.

For example, a bonding wire 259 is connected to the second portion 811 of the back-side pad 81Z. The back-side pad 81Z is electrically connected to the terminal 251 of the package substrate 250 via the bonding wire 259 connected to the second portion 811. The second portion 811 is hereinafter referred to as a wire connecting portion 811. The first portion 810 is referred to as an electrode connecting portion 810.

In FIG. 13, the back-side pad 81Z has a planar structure bent in a direction perpendicular to the extending direction (the direction from the contact region 180 toward the pixel array 120) of the electrode connecting portion 810. The wire connecting portion 811 is drawn out from the electrode connecting portion 810 to the side (second side) perpendicular to the side (first side) where the through-electrode 83 to which the electrode connecting portion 810 is connected is provided.

As shown in FIG. 14, a wire connecting portion 815 of the back-side pad 81Z may be drawn out diagonally to the extending direction of the electrode connecting portion 810 from the side surface of the electrode connecting portion 810 toward the side (second side) perpendicular to the side (first side) where the through-electrode 83 to which the electrode connecting portion 810 is connected is provided.

As shown in FIG. 13 and FIG. 14, the back-side pad 81Z having the bent planar structure is laid out at the corner (the end of each side in the extending direction) of the chip of the image sensor 100. Although one back-side pad 81Z having the electrode/wire connecting portion 810, 811 and 815 is provided at each of one end and the other on each side in the example shown in FIG. 13 and FIG. 14, two or more back-side pads 81Z having the electrode/wire connecting portions 810, 811 and 815 may be provided at one end (and the other) on each side.

In the present embodiment, the back-side pad 81Z of the back-side illumination image sensor 100 has a planar structure bent at right angles or a predetermined angle of inclination in accordance with the layout of the terminal of the package substrate. In the quadrangular back-side pad, the intersection of diagonal lines of the quadrangle is the central position of the pad. For example, when the back-side pad 81Z has the bent planar shape, the central position of the back-side pad 81Z is the position of the center of gravity of the pad 81Z.

An image sensor manufacturing method according to the present embodiment and the image sensor manufacturing method according to the first embodiment are only different in the patterning of the back-side pad 81Z and are substantially the same. Therefore, the image sensor manufacturing method according to the second embodiment is not described.

Depending on the layout of the pad of the image sensor and the layout of the terminal of the package substrate, the distance between the pad of the image sensor and the terminal of the package substrate/lead frame may be great.

As in the present embodiment, in accordance with the layout of the terminal of the package substrate 250, the back-side pad 81Z of the back-side illumination image sensor 100 has the portions (wire connecting portions) 811 and 815 which are bent in a direction (the side of the chip) that intersects with the direction extending from the contact region 180 toward the pixel array 120, and the portions 811 and 815 are drawn out to the vicinity of the terminal 251 of the package substrate 250. Thus, in the image sensor 100 according to the present embodiment, the length of the bonding wire 259 which connects the back-side pad 81Z of the image sensor to the terminal 251 of the package substrate 250 can be smaller than when the bonding wire 259 is connected to the rectangular back-side pad (electrode connecting portion 810).

As a result, the image sensor 100 according to the present embodiment and a camera module including this image sensor can reduce a short circuit (erroneous contact) between the bonding wires and the parasitic resistance and parasitic capacitance resulting from the bonding wires.

Furthermore, the image sensor 100 according to the present embodiment and a camera module including this image sensor can simplify the contact between the back-side pad 81Z of the image sensor 100 and the terminal 251 of the package substrate 250 via the bonding wire 259.

Therefore, the image sensor 100 according to the present embodiment and a camera module including this image sensor can improve the electrical characteristics. The image sensor 100 according to the present embodiment and a camera module including this image sensor can improve manufacturing yield.

As described above, according to the solid-state image sensing device of the second embodiment, advantageous effects similar to those in the first embodiment are obtained, and the electrical characteristics and manufacturing yield of the solid-state image sensing device (image sensor and camera module) can be improved.

(3) Third Embodiment

A solid-state image sensing device (for example, an image sensor) according to the third embodiment is described with reference to FIG. 15 and FIG. 16. In the present embodiment, the same components and functions as those in the first and second embodiments are described when necessary.

FIG. 15 is a schematic plan view showing a planar structure of an image sensor 100 according to the present embodiment. FIG. 16 is a schematic sectional view showing a sectional structure of the image sensor 100 according to the present embodiment. FIG. 16 schematically shows the sectional structure along the line A-A in FIG. 15.

For example, in a back-side illumination image sensor, a ground potential is applied to a light blocking film provided on the back side of a semiconductor substrate (semiconductor layer) in order to stabilize the operation of unit cells in an OB region.

As shown in FIG. 15 and FIG. 16, in the image sensor 100 according to the present embodiment, a back-side pad 81G for applying a ground voltage Vss to a chip of the image sensor 100 is connected to a light blocking film 81X via an interconnect (second interconnect) 818 provided on the back side of a semiconductor substrate 30. The interconnect 818 is in direct contact with the back-side pad 81 and the light blocking film 81X to which a voltage is applied.

For example, the back-side pad 81G for the ground voltage Vss is connected, via the interconnect 818 and an electrode 819 provided on the back side of the semiconductor substrate 30, to the entire peripheral circuit regions 125A and 125B or to regions 31A, 31B to which the ground voltage Vss is applied in a semiconductor region (P-type/N-type region or well region) within peripheral circuit regions 125A and 125B.

The back-side pad 81G for the ground voltage Vss may be connected to an element isolation impurity layer (P-type impurity layer) 98 of the pixel array 120 via the interconnect 818 and the electrode 819 provided on the back side of the semiconductor substrate 30.

When a voltage is applied from the back side of the semiconductor substrate, a high-concentration impurity layer may be formed in the semiconductor region in a contact surface between the semiconductor regions 31A and 31B and the metal film (electrode) 819 in order to reduce the contact resistance between the metal film and the semiconductor region.

Thus, the ground voltage Vss applied to the back-side pad 81G of the back-side illumination image sensor 100 is applied to the semiconductor regions 31A, 31B, and 98 in which elements are formed, via the interconnect 818 and the electrode 819 provided on the back side of the semiconductor substrate 30. This can improve the operating characteristics of the elements.

In accordance with the layout (and internal configuration) of the chip of the image sensor 100, the back-side pad 81G to which the ground voltage Vss is applied may be connected not only to the interconnect 818 and the light blocking film 81X on the back side of the semiconductor substrate 30 but also to an interconnect 91 and a plug 92 in an interlayer insulating film 90 on the front side of the semiconductor substrate 30 via a through-electrode 83. In this case, the ground voltage Vss from the outside of the chip of the image sensor 100 is applied to the inside of the chip of the image sensor 100 from both the front side and back side of the semiconductor substrate 30.

In the case described here, the ground voltage Vss applied to the back-side pad 81G is supplied to a predetermined circuit region by the use of the interconnect 818 and the electrode 819 on the back side of the semiconductor substrate 30. However, a drive voltage Vdd applied to the back-side pad may be supplied to a predetermined circuit region (semiconductor region) from the back side of the semiconductor substrate 30 by the use of the interconnect 818 and the electrode 819 on the back side of the semiconductor substrate 30.

The interconnect 818 and the electrode 819 on the back side of the semiconductor substrate 30 connected to the back-side pad 81G only differ in the patterning of the metal film deposited on the back side of the semiconductor substrate 30, and are substantially simultaneously formed by the use of the same material as the back-side pad 81G and the light blocking film 81X. Therefore, the image sensor manufacturing method according to the third embodiment is not described.

In the image sensor 100 according to the present embodiment, the voltages (ground voltage and power supply voltage) Vss and Vdd for driving the image sensor 100 are directly applied from the back-side pad 81G to the light blocking film 81X and the electrode 819 of the circuit region provided on the rear side of the semiconductor substrate 30 without passing through the interconnect 91 in the interlayer insulating film 90 of the image sensor 100 by the interconnect 818 provided on the back side of the semiconductor substrate 30. The back-side pad 81G to which the power supply voltage is applied is directly connected to the electrode 819 of the light blocking film 81X and peripheral circuit regions 125A and 125B by the use of the interconnect 818 formed on the back side of the semiconductor substrate 30. As a result, in the image sensor 100 according to the present embodiment, the interconnects can be drawn in the chip in a simpler manner than when the power supply voltages Vss and Vdd applied to the image sensor are applied to the light blocking film and the electrode on the back side of the semiconductor substrate via the interconnect provided on the front side of the semiconductor substrate alone.

In a general back-side illumination image sensor, interconnects are drawn on the front side of the semiconductor substrate 30 alone, and the chip size of the image sensor may depend not only on the area occupied by the pixel array and the peripheral circuit in the chip but also on the area of the interconnects drawn on the front side of the semiconductor substrate 30.

In the image sensor 100 according to the present embodiment, the interconnects (for example, a power supply line) of the image sensor are provided separately on the front side and back side of the semiconductor substrate 30. In the image sensor 100 according to the present embodiment, some of the interconnects (for example, the power supply line) which have heretofore been provided on the front side of the semiconductor substrate are provided on the back side of the semiconductor substrate 30.

Therefore, in the image sensor 100 according to the present embodiment, the space for drawing the interconnects on the front side of the semiconductor substrate can be reduced, and the chip size of the image sensor can be reduced, as compared with the case where the interconnects are only provided on the front side of the semiconductor substrate 30 in which the image sensor is formed.

The image sensor 100 according to the present embodiment allows a greater margin of the distance between the interconnects provided on the front side of the semiconductor substrate 30.

In the general back-side illumination image sensor, the power supply voltage applied to the back-side pad is applied to each circuit region via the interconnect on the front side of the semiconductor substrate 30. Therefore, the length of the interconnect is greater, and an IR drop may be greater.

In contrast, in the image sensor 100 according to the present embodiment, the power supply voltage (drive voltage or ground voltage) applied to the back-side pad 81 can be directly applied to each region from the back side of the semiconductor substrate 30 without passing through the interconnect (the interconnect and plug in the interlayer insulating film) on the front side of the semiconductor substrate 30. As a result, in the image sensor 100 according to the present embodiment, the length of the power supply line of the image sensor 100 can be smaller, the influence of the IR drop can be reduced, and the increase of the power consumption of the image sensor can be inhibited.

For example, in the image sensor 100 according to the present embodiment, the signal line alone can be provided on the front side of the semiconductor substrate 30 (in the interlayer insulating film), and the power supply line can be provided on the back side of the semiconductor substrate 30. In this case, it is possible to prevent the power supply line and the signal line from being adjacent to each other, and inhibit noise caused to the signal line by the power supply line.

As described above, according to the solid-state image sensing device of the third embodiment, the size of the solid-state image sensing device (image sensor or camera module) can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state image sensing device comprising:
   a semiconductor substrate including a first surface and a second surface opposite to the first surface;
   an insulating film covering an element on the first surface;
   a pixel array which is provided in the semiconductor substrate and which includes pixels configured to photoelectrically convert light applied on the side of the second surface;
   a plurality of contact regions provided in the semiconductor substrate;
   one or more through-electrodes which are respectively provided in the contact regions and which are pierced from the first surface toward the second surface; and
   a plurality of first pads which are provided on the side of the second surface to correspond to the respective contact regions and which extend in a first direction from the contact regions toward the pixel array,
   wherein the first pads comprise a power supply pad to which a power supply voltage is applied, and a test pad to which a test signal is supplied, and
   a number of through-electrodes connected to the power supply pad is greater than a number of through-electrodes connected to the test pad.

2. The solid-state image sensing device according to claim 1, wherein
   the number of through-electrodes provided in the contact region corresponding to each of the first pads is different in the respective first pads in accordance with the electrical characteristics required in each of the first pads.

3. The solid-state image sensing device according to claim 1, wherein
   the area of the contact region in which a first number of through-electrodes are provided is smaller than the area of the contact region in which a second number of through-electrodes are provided, the second number is greater than the first number.

4. The solid-state image sensing device according to claim 1, wherein
   at least one of the first pads includes a first portion extending along the first direction, and a second portion projecting from the side part of the first portion in a second direction that intersects with the first direction.

5. The solid-state image sensing device according to claim 4, wherein
   the first portion is in contact with the through electrode, and
   the second portion is connected, via a bonding wire, to a terminal in a package in which the semiconductor substrate is mounted.

6. The solid-state image sensing device according to claim 4, wherein
   the first pads are arranged along the second direction on a first side of the semiconductor substrate which extends along the second direction, and
   one end of the second portion is provided on a second side of the semiconductor substrate which extends along the first direction.

7. The solid-state image sensing device according to claim 1, further comprising:
   a light blocking film which is provided on the side of the second surface and which covers a light-blocked region in the pixel array to which light is not applied, and
   an interconnect which is provided on the side of the second surface and which connects the first pad to the light blocking film.

8. The solid-state image sensing device according to claim 7, wherein
   a first voltage is applied to the light blocking film via the first pad and the interconnect.

9. The solid-state image sensing device according to claim 1, wherein
   a central position of the first pad does not overlap a central position of the contact region in a direction parallel to the second surface.

10. The solid-state image sensing device according to claim 1, wherein
    a dimension from a central position of the contact region to one end of the first pad on the side of the pixel array is greater than a dimension from a central position of the contact region to the other end of the first pad on the side opposite to the pixel array.

11. The solid-state image sensing device according to claim 1, wherein
    the pixel array includes an effective region to which light is applied, and a light-blocked region to which light is not applied,
    a filter corresponding to one of a plurality of colors is provided on the side of the second surface for each of the pixels in the effective region, and
    a stack of two or more filters different in color is provided on the side of the second surface for the pixels in the light-blocked region.

12. The solid-state image sensing device according to claim 1, wherein
    a first resistance of the power supply pad and the through-electrode connected to the power supply pad is lower than a second resistance of the test pad and the through-electrode connected to the test pad.

13. A solid-state image sensing device comprising:
    a semiconductor substrate including a first surface and a second surface opposite to the first surface;
    an insulating film covering an element on the first surface;
    a pixel array which is provided in the semiconductor substrate and which includes pixels configured to photoelectrically convert light applied on the side of the second surface;
    a plurality of contact regions provided in the semiconductor substrate;
    one or more through-electrodes which are respectively provided in the contact regions and which are pierced from the first surface toward the second surface; and
    a plurality of first pads which are provided on the side of the second surface to correspond to the respective contact regions,
    wherein the number of through-electrodes provided in the each of the contact regions corresponding to the first pads is different in accordance with the electrical characteristics set in the first pads,
    the first pads comprise a power supply pad to which a power supply voltage is applied, and a test pad to which a test signal is supplied, and
    a number of through-electrodes connected to the power supply pad is greater than a number of through-electrodes connected to the test pad.

14. The solid-state image sensing device according to claim 13, wherein a first resistance of the power supply pad and the through-electrode connected to the power supply pad is lower than a second resistance of the test pad and the through-electrode connected to the test pad.

15. The solid-state image sensing device according to claim 13, wherein
the area of the contact region in which a first number of through-electrodes are provided is smaller than the area of the contact region in which a second number of through-electrodes are provided, the second number is greater than the first number.

* * * * *